(12) United States Patent
Inoue et al.

(10) Patent No.: US 7,554,419 B2
(45) Date of Patent: Jun. 30, 2009

(54) BALANCED FILTER AND DUPLEXER

(75) Inventors: Shogo Inoue, Kawasaki (JP); Takashi Matsuda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 225 days.

(21) Appl. No.: 11/802,129

(22) Filed: May 21, 2007

(65) Prior Publication Data

US 2007/0268092 A1 Nov. 22, 2007

(30) Foreign Application Priority Data

May 22, 2006 (JP) .............................. 2006-141956

(51) Int. Cl.
H03H 7/42 (2006.01)
H03H 7/18 (2006.01)
H03H 9/205 (2006.01)

(52) U.S. Cl. .......................... 333/26; 333/133; 333/189; 333/193

(58) Field of Classification Search ................. 333/133, 333/186, 193, 194, 195, 196, 189, 26
See application file for complete search history.

(56) References Cited

U.S. PATENT DOCUMENTS 6,751,470 B1 * 6/2004 Ella et al. ................. 455/552.1
6,876,273 B2 * 4/2005 Harada et al. ............... 333/133
6,963,257 B2 * 11/2005 Ella et al. .................... 333/133
7,408,424 B2 * 8/2008 Kearns et al. ................. 333/12
2007/0210876 A1 * 9/2007 Yahata et al. ................ 333/187

FOREIGN PATENT DOCUMENTS

| EP | 1 246 358 A | 10/2002 |
| EP | 1 261 143 A | 11/2002 |
| EP | 1 261 143 B1 | 11/2002 |
| EP | 1 641 119 A2 | 3/2006 |
| JP | 2000-114917 A | 4/2000 |
| JP | 2002-359542 A | 12/2002 |
| JP | 2003-347889 A | 12/2003 |
| JP | 2006-094457 A | 4/2006 |
| JP | 2006-129445 A | 5/2006 |
| WO | WO 2005/084090 A | 9/2005 |

OTHER PUBLICATIONS

Kim, et al. "High Performance RF Passive Integration on a Si Smart Substrate for Wireless Applications", ETRI Journal, vol. 25, Apr. 2, 2003.

(Continued)

*Primary Examiner*—Dean O Takaoka
(74) *Attorney, Agent, or Firm*—Arent Fox LLP

(57) ABSTRACT

A balanced filter includes: a filter that has at least one unbalanced signal terminal; a balun that is a lumped parameter balun that inputs or outputs signals with different phases generated based on a signal input or output from the unbalanced signal terminal of the filter, the balun being formed with an integrated passive device; and a mounting unit in which the filter and the balun are flip-chip mounted.

20 Claims, 40 Drawing Sheets

OTHER PUBLICATIONS

Hikita, et al., "Investigation of merged rx-differential output for multi-band saw front-end module", Proc. IEEE Ultrasonics Symposium, vol. 1, Oct. 5, 2003, pp. 393-396.

In-Ho Jeong, et al., "High Quality RF Passive Integration using 35/spl mu/m thick oxide manufacturing technology" Proc. Electronic Components and Technology Conference 2002, May 28, 2002, pp. 1007-1011.

Zoschke, et al. "Thin Film integration of passives—single components, filters, integrated passive devices", Proc. Electronic Components and Technology Conference, Jun. 1, 2004, pp. 294-301.

Arbuckle, et al., "Processing Technology for Integrated Passive Devices", Solid State Technology, vol. 43, No. 11, Nov. 2000, pp. 84-86, 88, 90.

Lakin, K.M Ed: "Thin Film Resonator Technology." IEEE International Frequency Control Symposium & PDA Exhibition Jointly with the $17^{th}$ European Frequency and Time Forum, May 4, 2003-May 8, 2003, pp. 765-778, XP010688892.

Ueda, M. et al. "Ultra-miniaturized and High Performance PCS SAW Duplexer with Steep Cut-Off Filters" 2004 IEEE Microwave Symposium Digest, Jun. 6, 2004-Jun. 11-2004, pp. 913-916, XP010728273.

Mitsutka, Hikita, et al: "SAW Front-End Module for GSM-Based-Dual-Band Cellular Phones with Direct-Conversion Demodulation" IEEE Transactions on Microwave Theory and Techniques, vol. 50, No. 11, Nov. 2002, XP011076735.

Hikino, O., et al.: "The New Approach to Realize Small Imbalances in Differential RX-outputs for SAW Front End Module." IEEE Ultrasonics Symposium, Aug. 23, 2004-Aug. 37, 2004, pp. 1086-1089, XP010784145.

Ikata, O., et al: "A Design of Antenna Duplexer Using Ladder Type Saw Filters." IEEE Ultasonics Symposium., vol. 1, Oct. 5, 1998-Oct. 8, 1998, pp. 1-4, XP000887986.

* cited by examiner

REFLECTOR

FIG. 13A  π-LCL, T-LCL
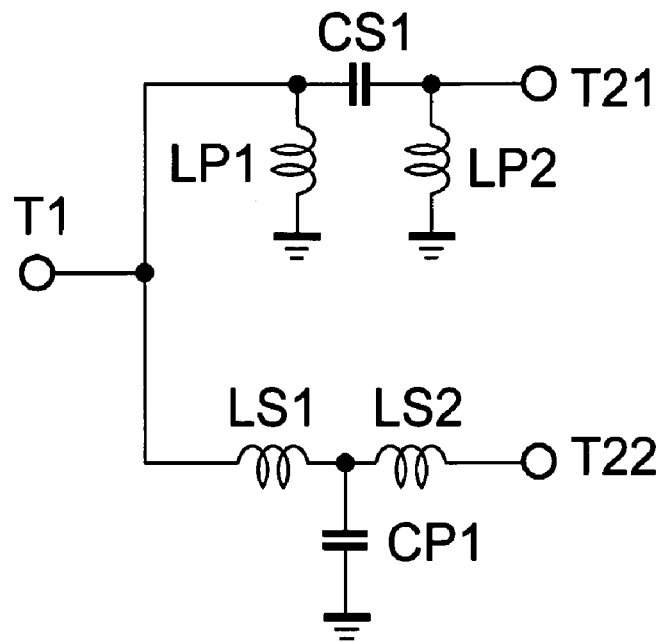
FIG. 13B  T-CLC, T-LCL
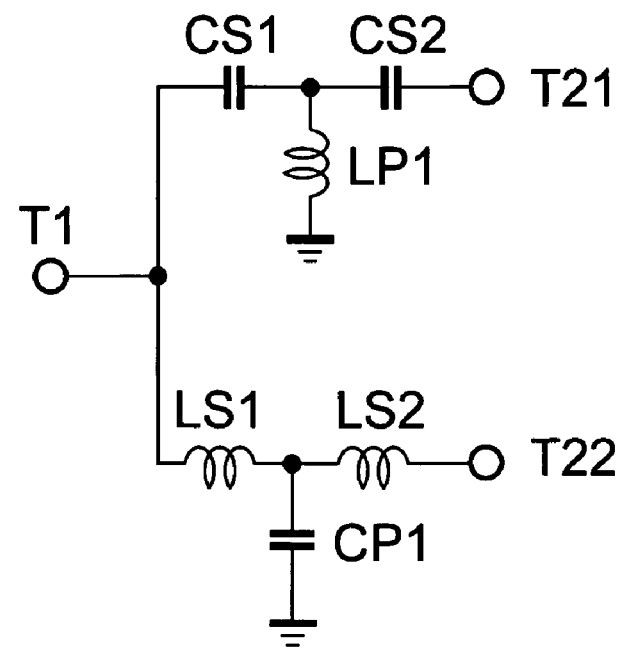

COMPARATIVE EXAMPLE  1ST EMBODIMENT

COMPARATIVE EXAMPLE 6

6TH EMBODIMENT

BALANCED FILTER AND DUPLEXER

BACKGROUND OF THE INVENTION

1. Field of the Invention

The present invention generally relates to a balanced filter and a duplexer, and more particularly, to a balanced filter and a duplexer that include a balun.

2. Description of the Related Art

In recent years, there are cases where signals on reception sides are differential signals, so as to restrain common mode noise in high-frequency circuits. With this trend, some high-frequency devices used for reception circuits are of a differential type (a balanced type). More specifically, balanced low-noise amplifiers (LNA) and balanced mixers are used.

FIG. 1 is a block diagram of a reception circuit in the vicinity of the antenna of a portable telephone device equipped with a balanced mixer 128. A signal that is received through a common terminal (antenna terminal) Ant is amplified by a LNA 122. An unbalanced reception filter 124 eliminates unnecessary signal components. The mixer 128 converts the signal into a low-frequency signal. Since the balanced mixer 128 has a balanced input, a balun 126 for unbalanced-to-balanced conversion is connected between the unbalanced reception filter 124 and the balanced mixer 128.

FIG. 2 is a block diagram of a reception circuit in the vicinity of the antenna of a portable telephone device equipped with a balanced LNA 136 and a balanced mixer 138. A signal that is received through a common terminal (antenna terminal) Ant passes through an unbalanced antenna duplexer 132, and reaches the reception circuit. After amplified by the balanced LNA 136, the signal is converted into a low-frequency signal by the balanced mixer 138. Since the LNA 136 has a balanced input, a balun 134 for unbalanced-to-balanced conversion is connected between the unbalanced antenna duplexer 132 and the LNA 136.

A ladder filter shown in FIG. 3 is often used as the unbalanced reception filter 124 or the unbalanced antenna duplexer 132. The ladder filter is designed to have series-arm resonators S1 through S4 connected in series and parallel-arm resonators P1 and P2 connected in parallel between an input terminal In and an output terminal Out. The resonators may be surface acoustic wave resonators, boundary acoustic wave resonators, or piezoelectric thin-film resonators, for example.

FIG. 4A is a plan view of a surface acoustic wave resonator. FIG. 4B is a cross-sectional view of the surface acoustic wave resonator, taken along the line A-A of FIG. 4A. As shown in FIG. 4A, a comb-like electrode (IDT: interdigital transducer) is formed on a piezoelectric substrate 50, and reflectors R0 are formed on both sides of the IDT. An input terminal In and an output terminal Out are connected to the IDT. As shown in FIG. 4B, electrodes 52 that form the IDT and the reflectors R0 are formed with a metal film on the piezoelectric electrode 50. In the surface acoustic wave resonator, an acoustic wave excited by the IDT becomes a standing wave on the surface of the piezoelectric substrate 50, and resonates with the frequency that is determined by the pitch of the electrodes 52 of the IDT and the propagation speed of the surface acoustic wave. With this arrangement, the surface acoustic wave resonator functions as a resonator.

FIG. 5A is a plan view of a boundary acoustic wave resonator. FIG. 5B is a cross-sectional view of the boundary acoustic wave resonator, taken along the line A-A of FIG. 5A. Unlike the structure shown in FIGS. 4A and 4B, the boundary acoustic wave resonator has a dielectric film 54 and a dielectric film 56 formed on the IDT and the reflectors R0. The other aspects of this structure are the same as those of the above described surface acoustic wave resonator. In the boundary acoustic wave resonator, an acoustic wave excited by the IDT becomes a standing wave in the dielectric film 54 that is the interface layer between the piezoelectric substrate 50 and the dielectric film 56. The standing wave then resonates with the frequency that is determined by the pitch of the electrodes 52 of the IDT and the propagation speed of the boundary acoustic wave.

FIG. 6A is a plan view of a piezoelectric thin-film resonator. FIG. 6B is a cross-sectional view of the piezoelectric thin-film resonator, taken along the line A-A of FIG. 6A. A lower electrode 62 and an upper electrode 66 are formed on an insulating substrate 60, so as to interpose a piezoelectric film 64. A void 68 or a multilayer reflection film or the like exists below the lower electrode 62. When a high-frequency signal is applied between the lower electrode 62 and the upper electrode 66, a standing wave of thickness longitudinal vibration is generated in the piezoelectric film 64, and resonates with the frequency that is determined by the film thickness of the piezoelectric film 64 and the propagation speed of the thickness longitudinal vibration.

FIG. 7 shows an example of a double-mode surface acoustic wave filter that is used in an unbalanced filter or an unbalanced duplexer. In the double-mode filter, an input IDT and output IDTs are formed on the piezoelectric substrate 50, and reflectors R0 are arranged outside the IDTs. In FIG. 7, two output IDTs (Out IDT) are provided between the two reflectors R0, and an input IDT (In IDT) is provided between the two output IDTs (Out IDT). The outputs of the two output IDTs (Out IDT) are connected to an output terminal Out. The input IDT is connected to an input terminal In. In a double-mode boundary acoustic wave filter, the dielectric films 54 and 56 shown in FIG. 5B are formed on the IDTs and the reflectors R0 shown in FIG. 7.

An unbalanced antenna duplexer is formed with a transmission filter 20, a reception filter 10, and a matching circuit 30. FIG. 8 illustrates the structure of an unbalanced duplexer that includes ladder filters serving as the transmission filter 20 and the reception filter 10. The transmission filter 20 is connected between a common terminal Ant and a transmission terminal Tx. The transmission filter 20 includes series-arm resonators S21 through S24 and parallel-arm resonators P21 and P22. The reception filter 10 is connected between the common terminal Ant and a reception terminal Rx. The reception filter 10 includes series-arm resonators S11 through S14 and parallel-arm resonators P11 through P13. The matching circuit 30 is provided between the common terminal Ant and the reception filter 10.

A device that can be used as the matching circuit 30 of the duplexer shown in FIG. 8 is now described. FIG. 9A shows a strip line/microstrip line. The strip line/microstrip line MS is formed on the surface of an inner layer of a ceramic package that houses filter chips. FIGS. 9B and 9C show lumped-parameter phase shifters. Those phase shifters are formed with integrated passive devices (IPD), or with chip components (such as chip capacitors and chip inductors) FIG. 9D shows a resonator S1 to which a parallel inductor L1 is connected. The resonator S1 may be a surface acoustic wave resonator, a boundary acoustic wave resonator, or a piezoelectric thin-film resonator, for example. The parallel inductor L1 may be an IPD or a chip component.

The balun for unbalanced-to-balanced conversion illustrated in the circuits of FIGS. 1 and 2 normally has high insertion loss and is large in size, which adds to the costs and the weight. To counter this problem, Japanese Unexamined Patent Publication Nos. 2000-114917 and 2002-359542 disclose the technique of containing a balun for unbalanced-tobalanced conversion in an unbalanced filter or an unbalanced duplexer. With this arrangement, a smaller-sized, light-weight balanced filter and duplexer can be provided.

FIG. 10 is a circuit diagram of a balanced filter. Series-arm resonators S1 through S3 are connected in series, and parallel-arm resonators P1 and P2 are connected in parallel between an unbalanced input terminal In and an unbalanced output terminal T1. With this arrangement, the unbalanced ladder filter 10 is formed. A balun 40 includes the unbalanced terminal T1 and two balanced terminals T21 and T22. A signal that is input through the unbalanced terminal T1 is output from the two balanced terminals T21 and T22. A first capacitor CS is connected in series between the unbalanced terminal T1 and the balanced terminal T21, and a first inductor LP is connected to the balanced terminal T21 and the ground. A second inductor LS is connected in series between the unbalanced terminal T1 and the balanced terminal T22, and a second capacitor CP is connected to the balanced terminal T22 and the ground. With this structure, a small-sized, low-cost filter and duplexer can be provided, and such a filter and duplexer can be connected directly to a balanced LNA and a balanced mixer.

However, where balanced filters are formed with the structures disclosed in Japanese Unexamined Patent Publication Nos. 2000-114917 and 2002-359542, the following two problems are caused. One of the two problems is that the insertion loss of the balun is high, and the filters have high insertion loss accordingly, because lumped parameter devices with low Q values are employed. In Japanese Unexamined Patent Publication Nos. 2000-114917 and 2002-359542, the inductors of baluns are formed with bonding wires, surface acoustic wave resonators, or piezoelectric resonators, and the capacitors are formed with surface acoustic wave resonators or piezoelectric thin-film resonators. In cases where bonding wires, surface acoustic wave resonators, or piezoelectric thin-film resonators are used as inductors or capacitors, the Q values are normally very low. Accordingly, even if a balun is structured with bonding wires, surface acoustic wave resonators, or piezoelectric thin-film resonators, the insertion loss becomes high, and it is unlikely to be able to achieve the required performance as a portable telephone system.

The second problem is that the balance characteristics as a balanced filter or duplexer are poor. The "balance characteristics" include the amplitude difference and phase difference between the differential signals that are output from the two balanced output terminals of a balance filter, which are referred to as the amplitude balance and the phase balance, respectively. The amplitude balance is best at 0 dB, and the phase balance is best at 180 degrees. In a case of a balanced filter having a balun connected to an unbalanced filter (the balanced filter will be hereinafter referred to as the balun-containing balanced filter), the balance characteristics of the balanced filter are basically the balance characteristics of the contained balun. In general, a lumped parameter balun does not excel in balance characteristics, having the amplitude balance of ±0.5 dB and the phase balance of 180 degrees ±5 degrees.

Furthermore, where the inductors of a lumped parameter balun are formed with bonding wires, surface acoustic wave resonators, or piezoelectric thin-film resonators, and the capacitors are formed with surface acoustic wave resonators or piezoelectric thin-film resonators as in Japanese Unexamined Patent Publication Nos. 2000-114917 and 2002-359542, the balance characteristics deteriorate further, due to the frequency dependence of the inductance value and the capacitance value. The amplitude balance becomes ±1 dB, and the phase balance becomes 180 degrees ±10 degrees. With such balance characteristics, high performance of a high-frequency IC to be connected in a later stage cannot be guaranteed.

SUMMARY OF THE INVENTION

It is therefore an object of the present invention to provide a balanced filter and a duplexer in which the above disadvantages are eliminated.

A more specific object of the present invention is to provide a balanced filter and a duplexer that includes a balun formed with a lumped parameter device having a high Q value, so as to restrain loss. Another specific object of the present invention is to provide a balanced filter and a duplexer that can greatly improve the amplitude balance and the phase balance.

According to an aspect of the present invention, there is provided a balanced filter including: a filter that has at least one unbalanced signal terminal; a balun that is a lumped parameter balun that inputs or outputs signals with different phases generated based on a signal input or output from the unbalanced signal terminal of the filter, the balun being formed with an integrated passive device; and a mounting unit in which the filter and the balun are flip-chip mounted.

According to another aspect of the present invention, there is provided a balanced filter including: a filter that has at least one unbalanced signal terminal; a lumped parameter balun that inputs or outputs signals with different phases generated based on a signal input or output from the unbalanced signal terminal of the filter, the lumped parameter balun having two or more ground terminals; and a ground inductor that is connected between a node and a ground, the node being shared by at least one ground terminal of the filter and at least one of the ground terminals of the balun.

According to a further aspect of the present invention, there is provided a duplexer including: a common terminal; and two filters that are connected to the common terminal, at least one of the two filters being the balanced filter as mentioned above.

BRIEF DESCRIPTION OF THE DRAWINGS

Other objects, features and advantages of the present invention will become more apparent from the following detailed description when read in conjunction with the accompanying drawings, in which:

FIGS. 13A and 13B are circuit diagrams showing further examples of lumped parameter circuits that form baluns;

DESCRIPTION OF THE PREFERRED EMBODIMENTS

The following is a description of embodiments of the present invention, with reference to the accompanying drawings.

First Embodiment

Figure 11:
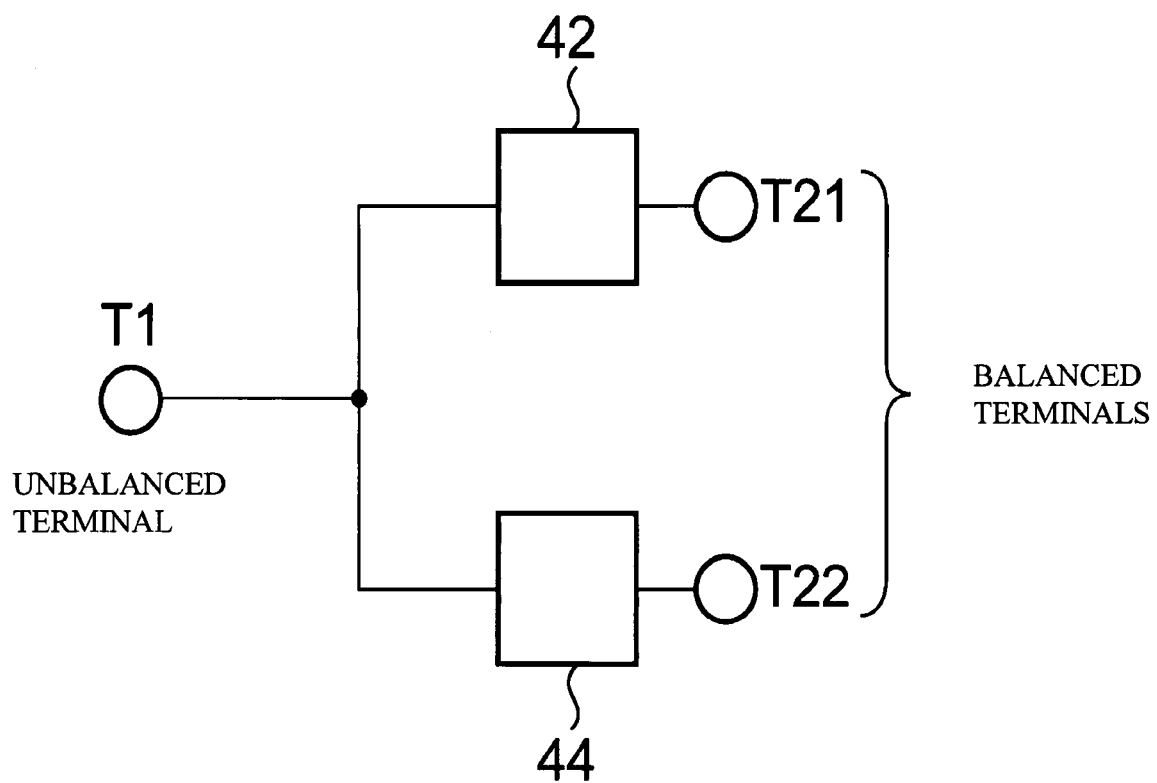
FIG. 11 is a block diagram illustrating the functions of a balun.

First, a balun (a lumped parameter balun) formed with inductors and capacitors that are lumped parameter devices is described. FIG. 11 illustrates the fundamental structure of a lumped parameter balun. The lumped parameter balun includes an unbalanced terminal T1 and two balanced terminals T21 and T22. A circuit 42 that advances the phase by 90 degrees is provided between the unbalanced terminal T1 and the balanced terminal T21, and a circuit 44 that delays the phase by 90 degrees is provided between the unbalanced terminal T1 and the balanced terminal T22. With this arrangement, signals that are input to the unbalanced terminal T1 are output from the balanced terminals T21 and T22 as signals having phases that differ by 180 degrees.

Figure 10:
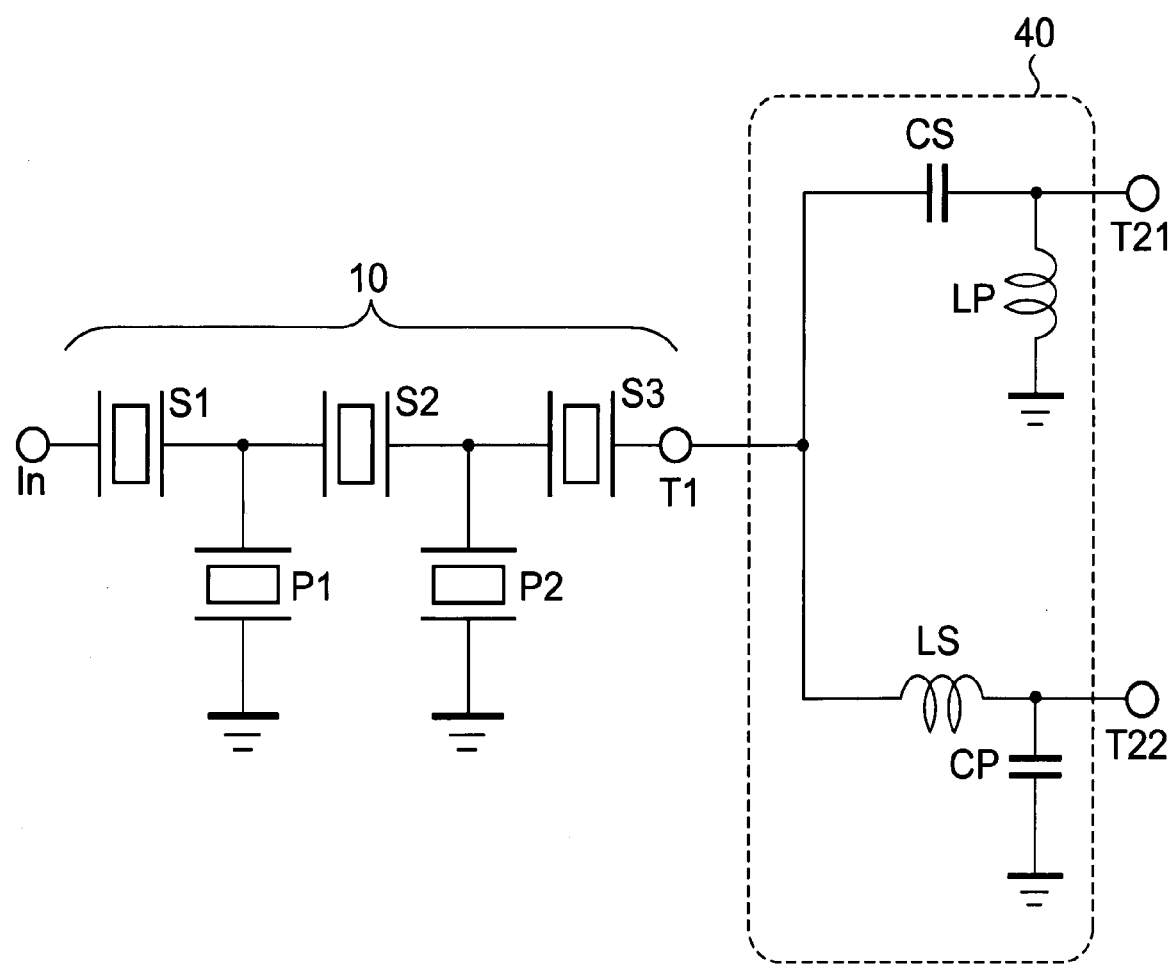
FIG. 10 is a circuit diagram of a filter having a balun connected to an unbalanced filter.
Figure 12A:
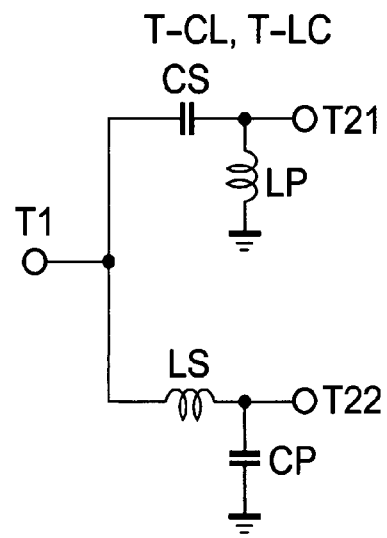
FIGS. 12A through 12C are circuit diagrams showing examples of lumped parameter circuits that form baluns.
Figure 12B:
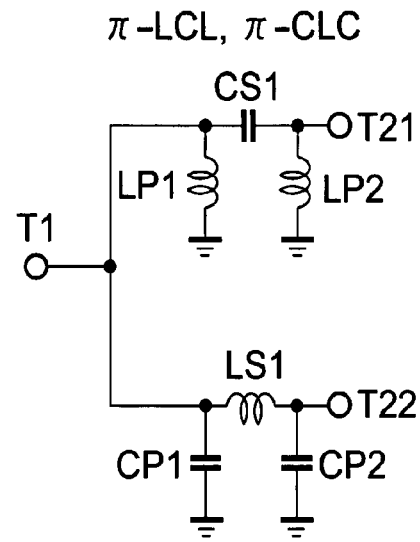
Figure 12C:
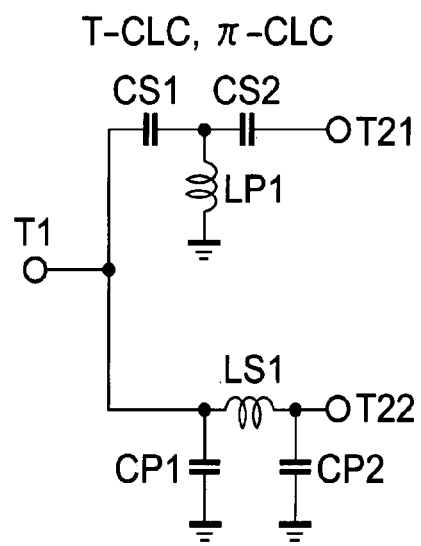

FIGS. 12A through 13B show examples of baluns including lumped parameter devices. FIG. 12A shows the same structure as the balun 40 shown in FIG. 10, and includes a T-CL circuit and T-LC circuit. The balun shown in FIG. 12B has a π-LCL circuit interposed between the unbalanced terminal T1 and the balanced terminal T21, and a π-CLC circuit interposed between the unbalanced terminal T1 and the balanced terminal T22. The balun shown in FIG. 12C has a T-CLC circuit interposed between the unbalanced terminal T1 and the balanced terminal T21, and a π-CLC circuit interposed between the unbalanced terminal T1 and the balanced terminal T22. The balun shown in FIG. 13A has a π-LCL circuit interposed between the unbalanced terminal T1 and the balanced terminal T21, and a T-LCL circuit interposed between the unbalanced terminal T1 and the balanced terminal T22. The balun shown in FIG. 13B has a T-CLC circuit interposed between the unbalanced terminal T1 and the balanced terminal T21, and a T-LCL circuit interposed between the unbalanced terminal T1 and the balanced terminal T22.

In each of those lumped parameter baluns, at least one of first capacitors CS, CS1, and CS2 is connected in series between the unbalanced terminal T1 and the balanced terminal T21, and at least one of first inductors LP, LP1, and LP2 is connected between the balanced terminal T21 and the ground. Also, at least one of second inductors LS, LS1, and LS2 is connected in series between the unbalanced terminal T1 and the balanced terminal T22, and at least one of second capacitors CP, CP1, and CP2 is connected between the balanced terminal T22 and the ground. The baluns including the lumped parameter devices are not limited to the above, and various combinations of the above baluns can be made. The circuit that is most often used is the circuit shown in FIG. 12A, which has the smallest number of elements. More specifically, such a circuit is formed with the single first capacitor CS, the single first inductor LP, the single second inductor LS, and the single second capacitor CP.

We calculated the bandpass characteristics and the balance characteristics of the balun that is most used and shown in FIG. 12A. The inductance value and the capacitance value were set so as to obtain a balun for the reception band (the band area: 1930 MHz to 1990 MHz) of PCS (Personal Communications Service), which is a North American mobile phone system. The two values L and C are expressed by the following equations (1) and (2):

$$L = \frac{\sqrt{Z_{in} \cdot Z_{out}}}{2\pi f_0} \quad (1)$$

$$C = \frac{1}{2\pi f_0 \sqrt{Z_{in} \cdot Z_{out}}} \quad (2)$$

where $Z_{in}$, $Z_{out}$, and f0 represent the input impedance, the output impedance, and the center frequency of the balun, respectively. If $Z_{in}$=50Ω, $Z_{out}$=100Ω, and f0=1960 MHz, the value L is 5.74 nH and the value C is 1.15 pF in accordance with the equations (1) and (2).

Figure 14A:
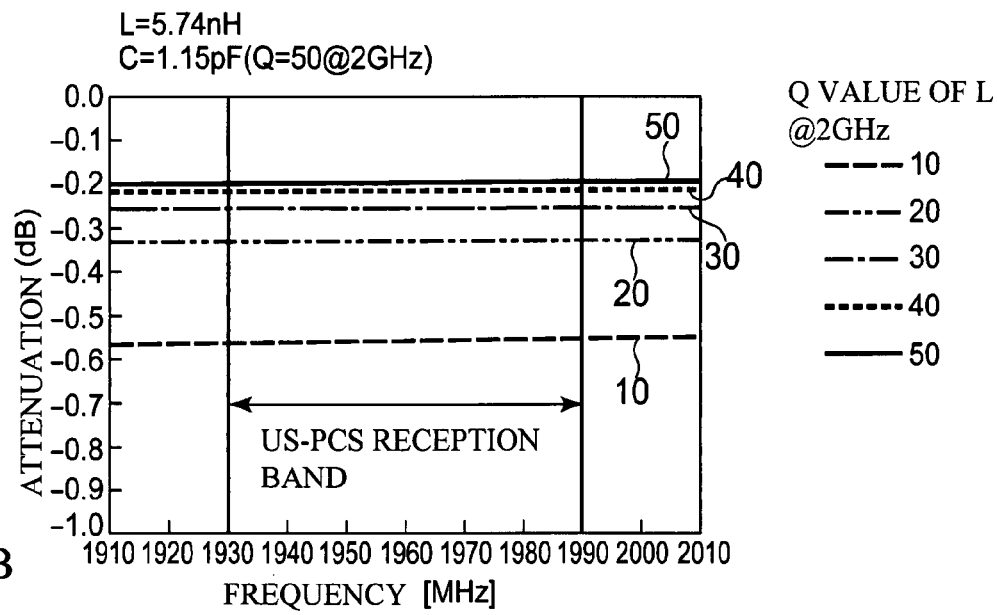
FIGS. 14A through 14C show the insertion loss, the amplitude balance, and the phase balance, with the Q value of the inductor L of the balun being varied.
Figure 14B:
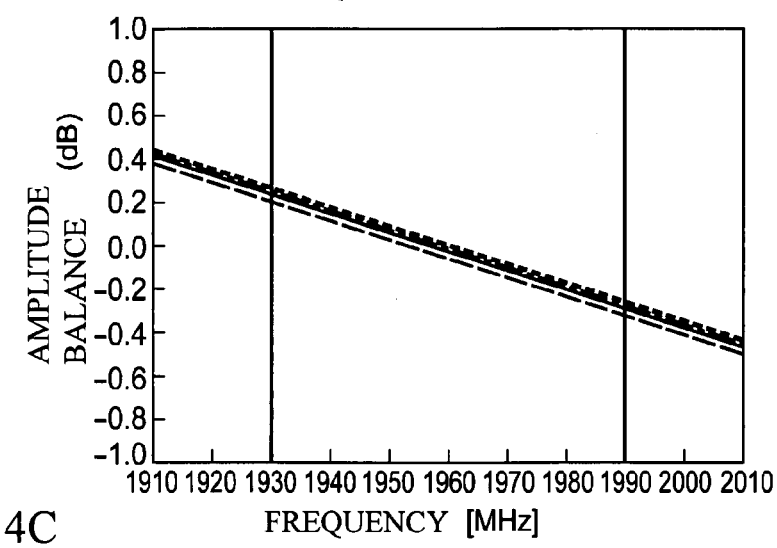
Figure 14C:
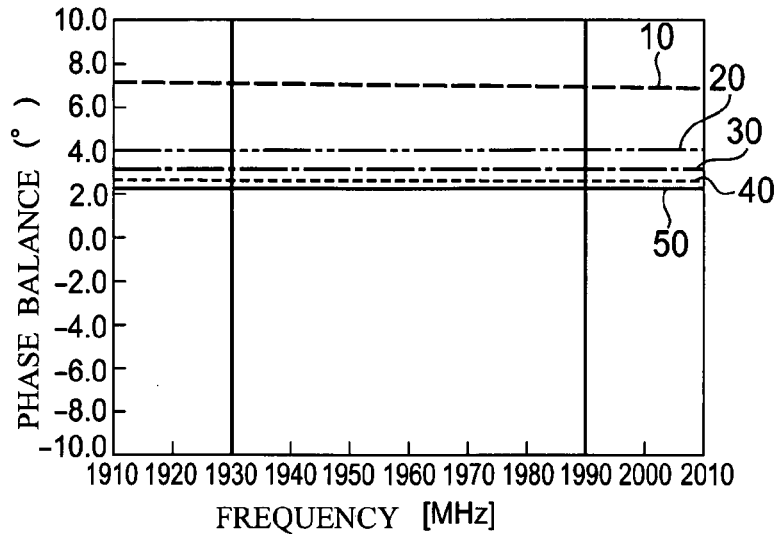
Figure 15A:
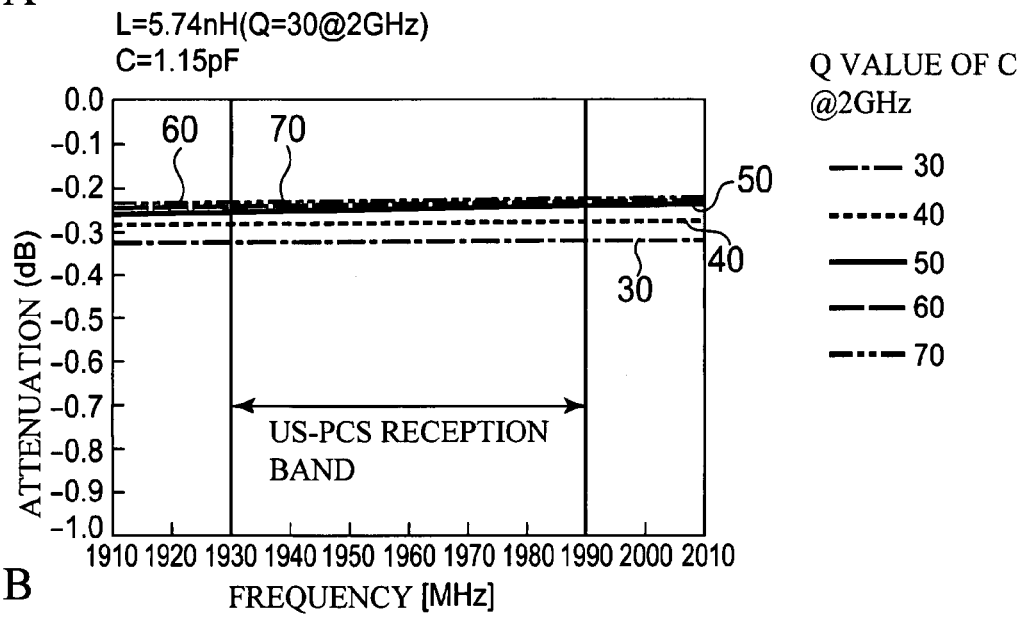
FIGS. 15A through 15C show the insertion loss, the amplitude balance, and the phase balance, with the Q value of the capacitor C of the balun being varied.
Figure 15B:
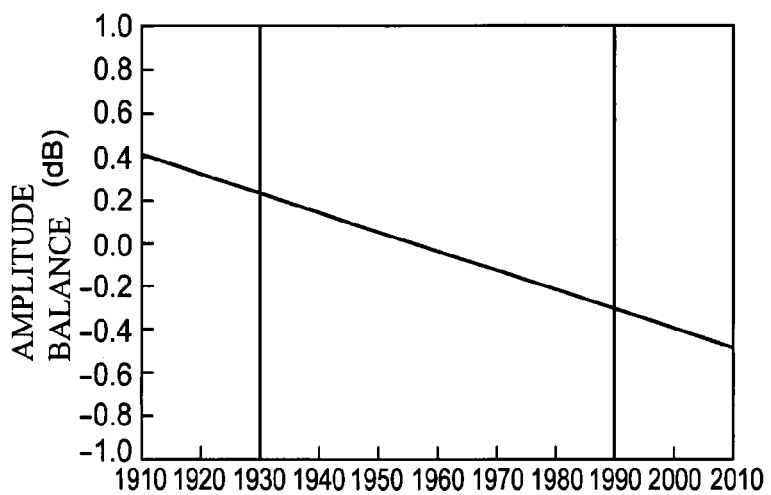
Figure 15C:
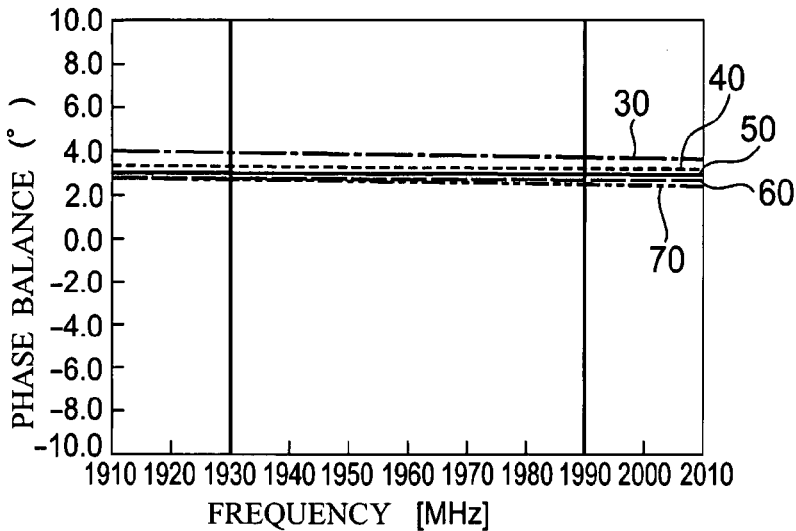

To examine the influence of the Q'values of L and C on the balance characteristics, the balance characteristics were calculated, with the Q value of L or C being varied. FIGS. 14A through 14C show the attenuation amount, the amplitude balance, and the phase balance with respect to frequencies, where the Q value of C was fixed at 50 at 2 GHz, and the Q value of L was varied from 10 to 50. The phase balance is represented by shifts from 180 degrees. More specifically, when the phase balance is 0 degree, the phase difference between the outputs from balanced output terminals 1 and 2 is 180 degrees. FIGS. 15A through 15C show the attenuation amount, the amplitude balance, and the phase balance with respect to frequencies, where the Q value of L was fixed at 30 at 2 GHz, and the Q value of C was varied from 30 to 70.

As can be seen from FIGS. 14A and 15A, the frequency dependence of the insertion loss in the pass band (the reception band) is substantially constant, regardless of the Q values of L and C. However, as the Q values of L and C become smaller, the insertion loss becomes larger. In a case where a bonding wire, a surface acoustic wave resonator, or a piezoelectric thin-film resonator is used as the inductor of a balun as in Patent Documents 1 and 2, the Q value of L is approximately 10. In a case where a surface acoustic wave resonator or a piezoelectric thin-film resonator is used as the capacitor, the Q value of C is approximately 20. Accordingly, based on the graphs shown FIGS. 14A and 15A, the insertion loss in the cases of Patent Documents 1 and 2 becomes approximately 0.7 dB.

As can be seen from FIGS. 14B and 15B, the amplitude balance of the balun exhibits little Q-value dependence of L and C, but exhibits frequency dependence. Even if the amplitude balance is designed to be 0 dB at the center frequency of the reception band, the amplitude balance becomes approximately ±0.3 dB at both ends of the reception band.

As can be seen from FIGS. 14C and 15C, the phase balance exhibits low frequency dependence, but deteriorate when the Q values of L and C become smaller. For example, in the cases of Patent Documents 1 and 2, the phase balance becomes ±8 degrees, where the Q value of L is 10 and the Q value of C is 20.

Figure 16A:
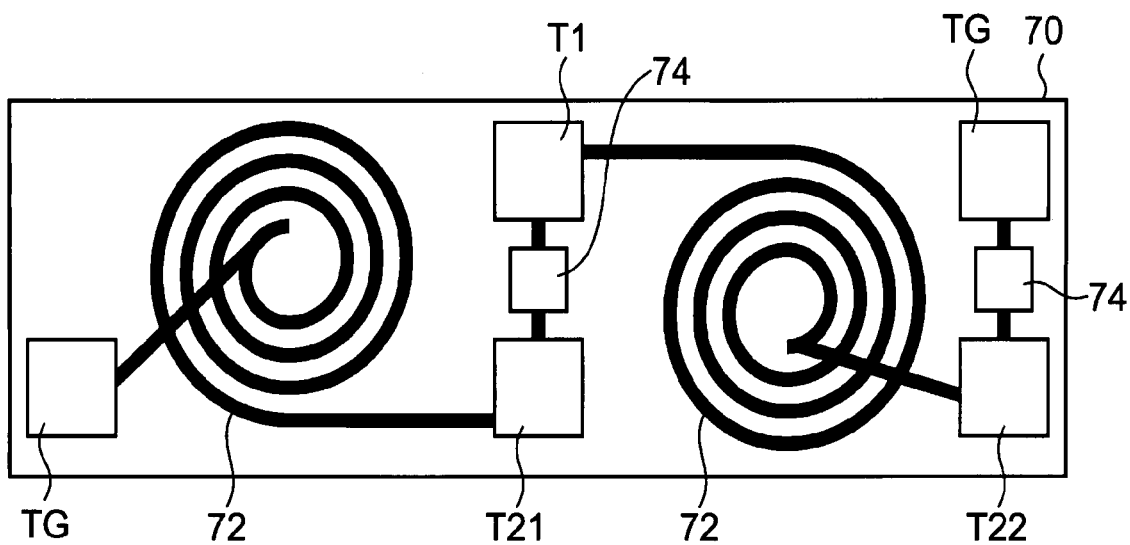
FIG. 16A is a plan view of an integrated passive device that forms the balun of a filter in accordance with the first embodiment.
Figure 16B:
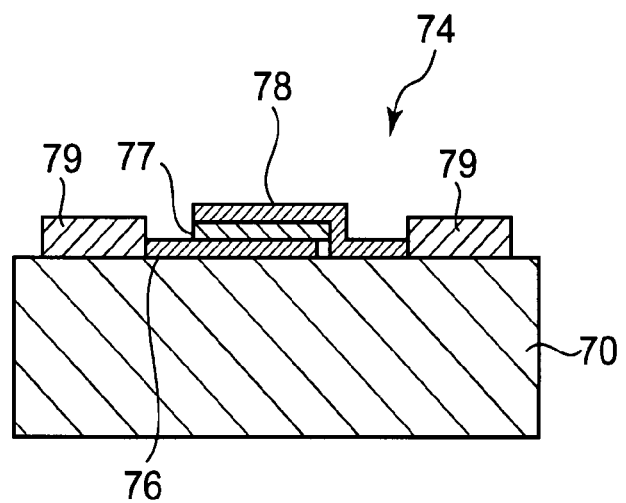
FIG. 16B is a cross-sectional view of a capacitor of the balun.

In the first embodiment, a balun is formed with an integrated passive device, so that L and C with high Q values can be used, and the insertion loss and the phase balance can be made smaller. FIG. 16A is a plan view of an integrated passive device (IPD) chip 41 that constitutes a balun of the first embodiment. FIG. 16B is a cross-sectional view of a capacitor. As shown in FIG. 16A, a spiral coil 72 formed with a metal film such as a copper film is formed on a substrate 70 made of quartz or the like. As shown in FIG. 16B, a lower electrode 76 formed with a metal film such as a copper film, a dielectric film 77 formed with a silicon oxide film or the like, and an upper electrode 78 formed with a metal film are formed on a substrate 70, so as to form a MIM capacitor 74. As shown in FIG. 16A, the MIM capacitor 74 is connected as the first capacitor CS between the unbalanced terminal T1 and the balanced terminal T21, and the spiral coil 72 is connected as the first inductor LP between the balanced terminal T21 and the ground terminal TG. The spiral coil 72 is connected as the second inductor LS between the unbalanced terminal T1 and the balanced terminal T22, and the MIM capacitor 74 is connected as the second capacitor CP between the balanced terminal T22 and the ground terminal TG. With this arrangement, the balun 40 including the IPD is formed.

Figure 17:
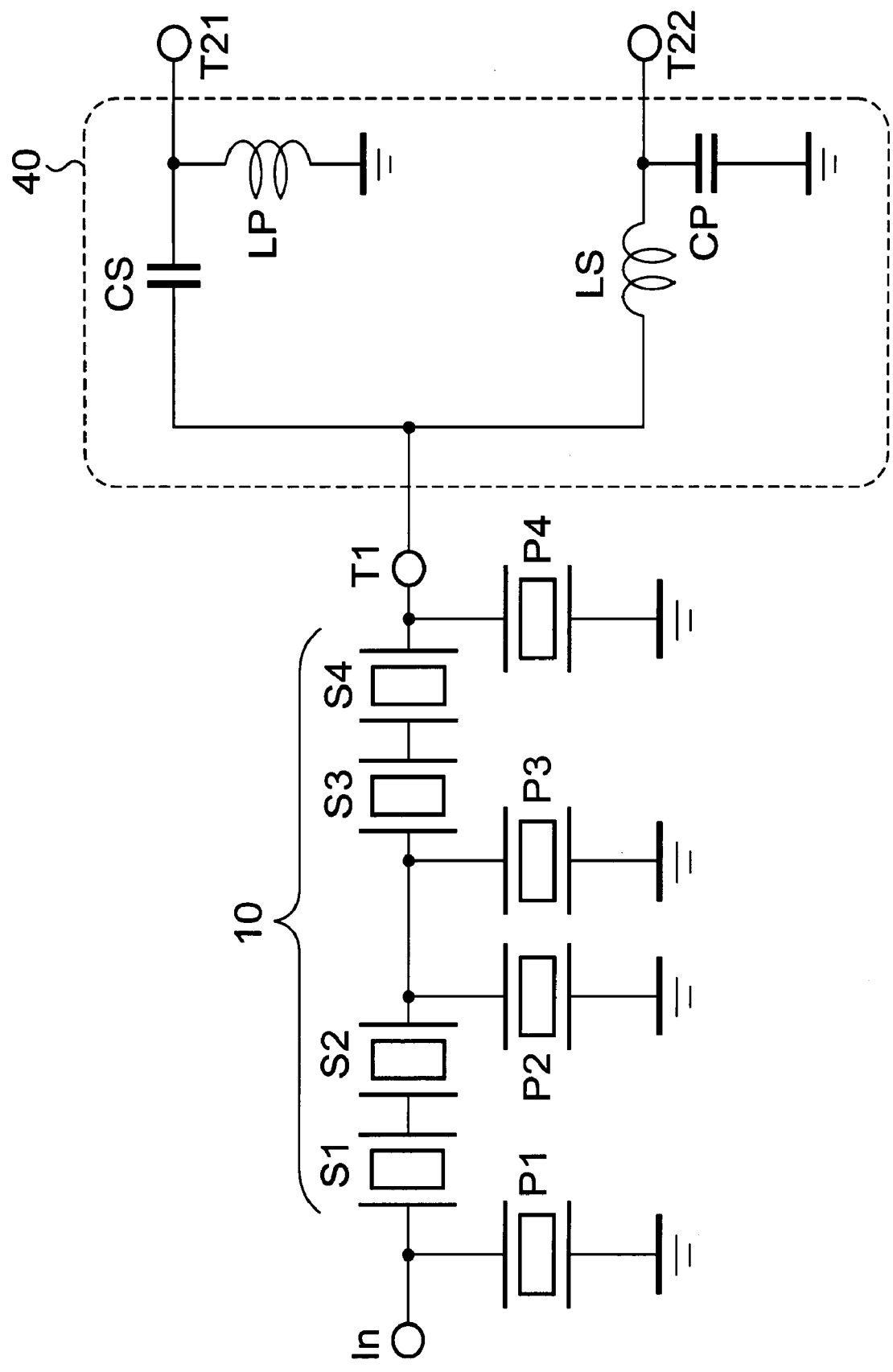
FIG. 17 is a circuit diagram of a filter that includes the balun formed with an integrated passive device in accordance with the first embodiment.

FIG. 17 is a circuit diagram of a balun-containing filter of the first embodiment that includes the balun shown in FIGS. 16A and 16B. As shown in FIG. 17, the unbalanced ladder filter 10 that includes surface acoustic wave series-arm resonators S1 through S4 and parallel-arm resonators P1 through P4 is connected between an unbalanced input terminal In and the unbalanced terminal T1. The IPD balun 40 shown in FIGS. 16A and 16B is connected to the unbalanced terminal T1. A signal that is output from the unbalanced signal terminal of the filter 10 is input to the unbalanced terminal T1 of the balun 40, and signals with different phases (generally, signals having phases that differ from each other by 180 degrees) are input to the balanced terminals T21 and T22. In the IPD balun 40, the first capacitor CS is connected in series between the unbalanced terminal T1 and the balanced terminal T21, the first inductor LP is connected in parallel between the unbalanced terminal T1 and the balanced terminal T21, the second inductor LS is connected in series between the unbalanced terminal T1 and the balanced terminal T22, and the second capacitor CP is connected in parallel between the unbalanced terminal T1 and the balanced terminal T22.

Figure 18:
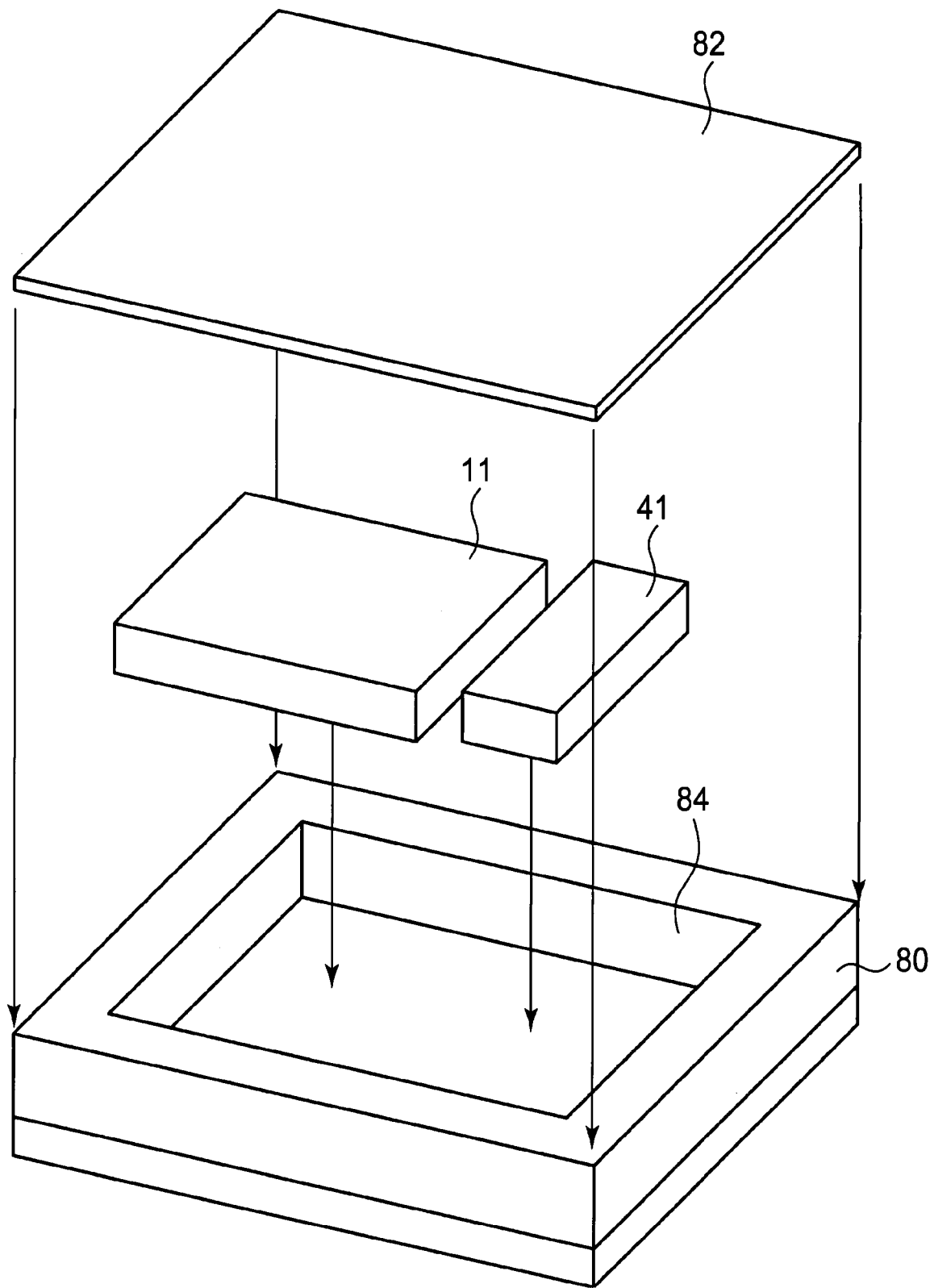
FIG. 18 shows an example case where a filter in accordance with the first embodiment is mounted in a stacked package.

FIG. 18 shows a structure in which the structure of the first embodiment is mounted. A filter chip 11 having the series-arm resonators S1 through S4 and the parallel-arm resonators P1 through P4 formed therein, and the IPD chip 41 having the balun 40 formed therein are flip-chip mounted in a stacked package 80 having a cavity 84. A metal lid is provided as a cap 82 on the stacked package 80, so as to hermetically seal the cavity 84.

Figure 19A:
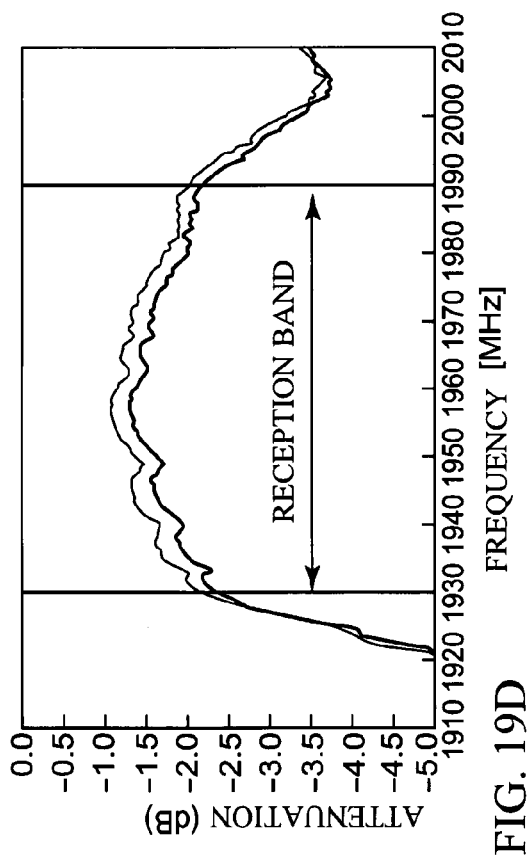
FIGS. 19A through 19D show the bandpass characteristics and the balance characteristics of Comparative Example 1 not equipped with a balun and the first embodiment having a balun.
Figure 19B:
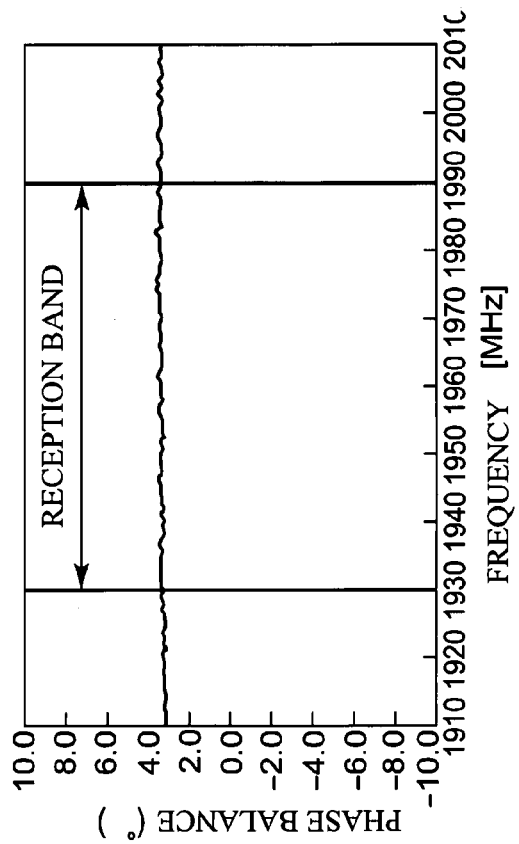
Figure 19C:
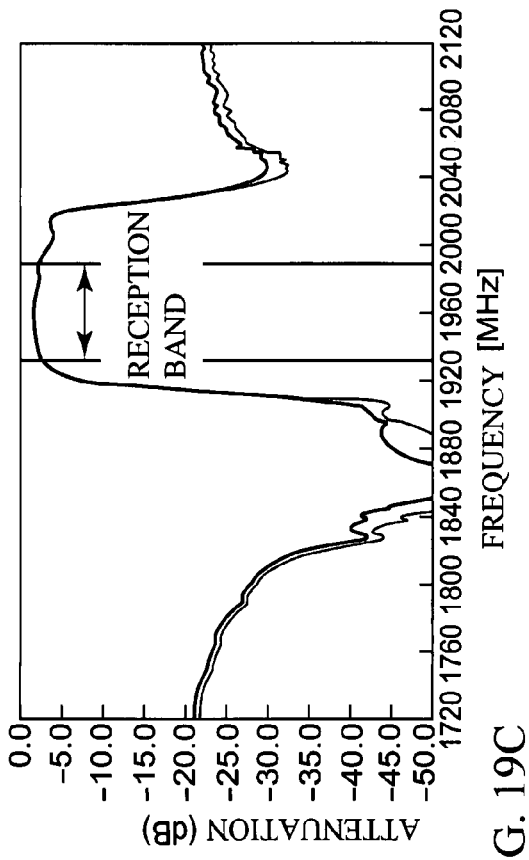
Figure 19D:
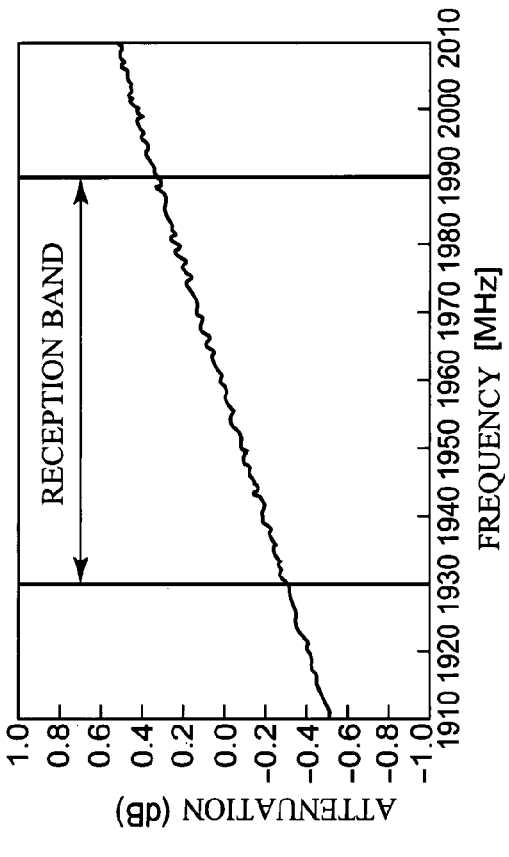

FIGS. 19A through 19D show the bandpass characteristics, an enlarged view of the vicinities of the reception band, the amplitude balance, and the phase balance of the balun-containing filter (a balance filter) of the first embodiment. FIGS. 19A and 19B also show the characteristics of an unbalanced filter as Comparative Example 1 that does not have a balun. As can be seen from FIG. 19B, the increase in insertion loss caused by the addition of the balun 40 is approximately 0.2 dB. Accordingly, the insertion loss in the first embodiment is much smaller than 0.7 dB, which is the insertion loss calculated when a balun is added in the cases of Patent Documents 1 and 2. As can be seen from FIG. 19C, the amplitude balance at either end of the reception band is ±0.3 dB with respect to the center frequency, and the results shown in FIGS. 14B and 15B are again achieved. As can be seen from FIG. 19D, the phase balance is 180 degrees ±3 degrees, which is much smaller than the phase balance of ±8 degrees in the cases of Patent Documents 1 and 2.

In accordance with the first embodiment, the filter 10 has at least one unbalanced signal terminal, and the lumped parameter balun 40 inputs and outputs signals with different phases from each other, based on a signal that is input and output from the unbalanced terminal T1 (the unbalanced signal terminal) of the filter 10. The first embodiment provides the balun 40 formed with an integrated passive device, and the stacked package 80 (the mounting unit) having the filter 10 and the balun 40 flip-chip mounted therein. With this structure, IPD inductors and IPD capacitors with high Q values can be used, so as to reduce the insertion loss and to improve the phase balance. In the first embodiment, the stacked package 80 is used as the mounting unit. However, a package that includes a substrate and an organic insulating film may be employed, as long as it can house the filter 10 and the balun 40.

Second Embodiment

Figure 20A:
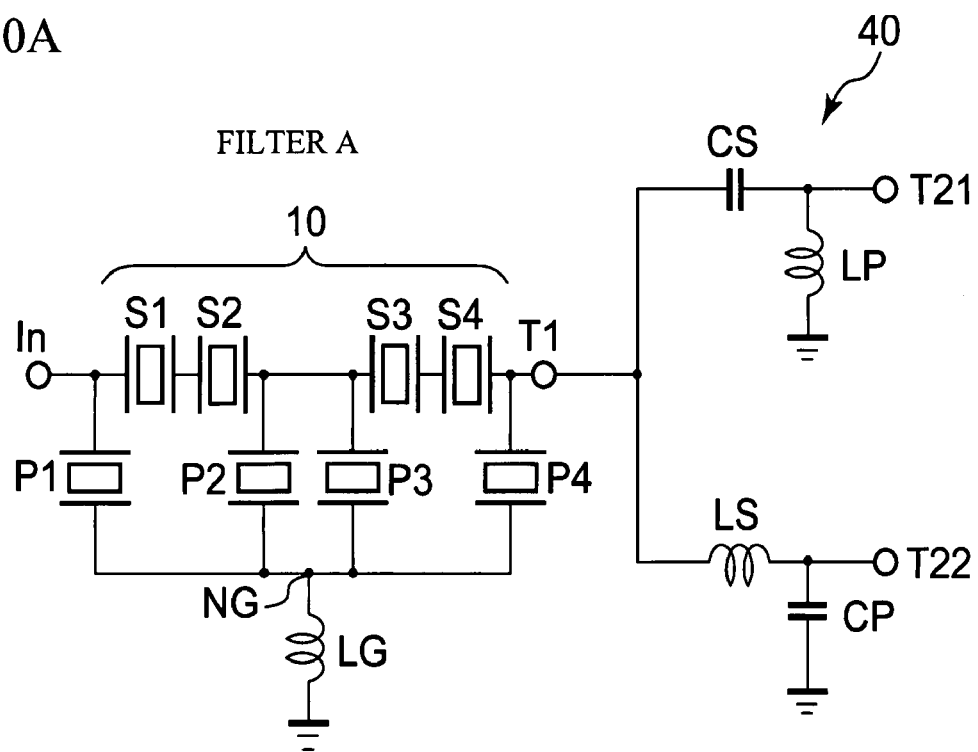
FIGS. 20A and 20B are circuit diagrams of a filter A and a filter B in accordance with a second embodiment of the present invention.
Figure 20B:
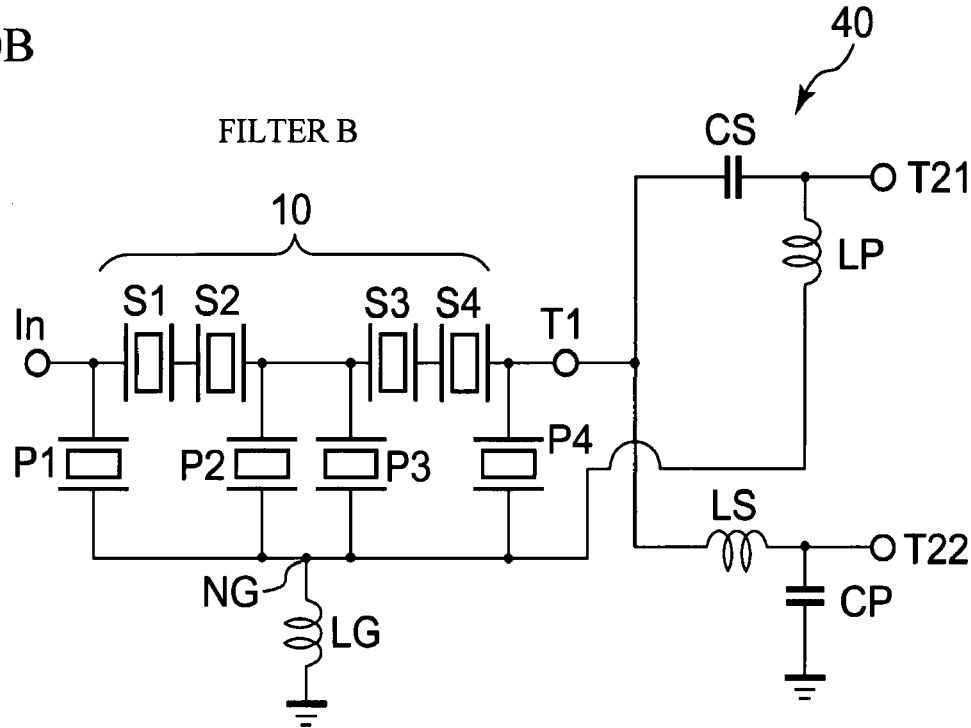
Figure 21A:
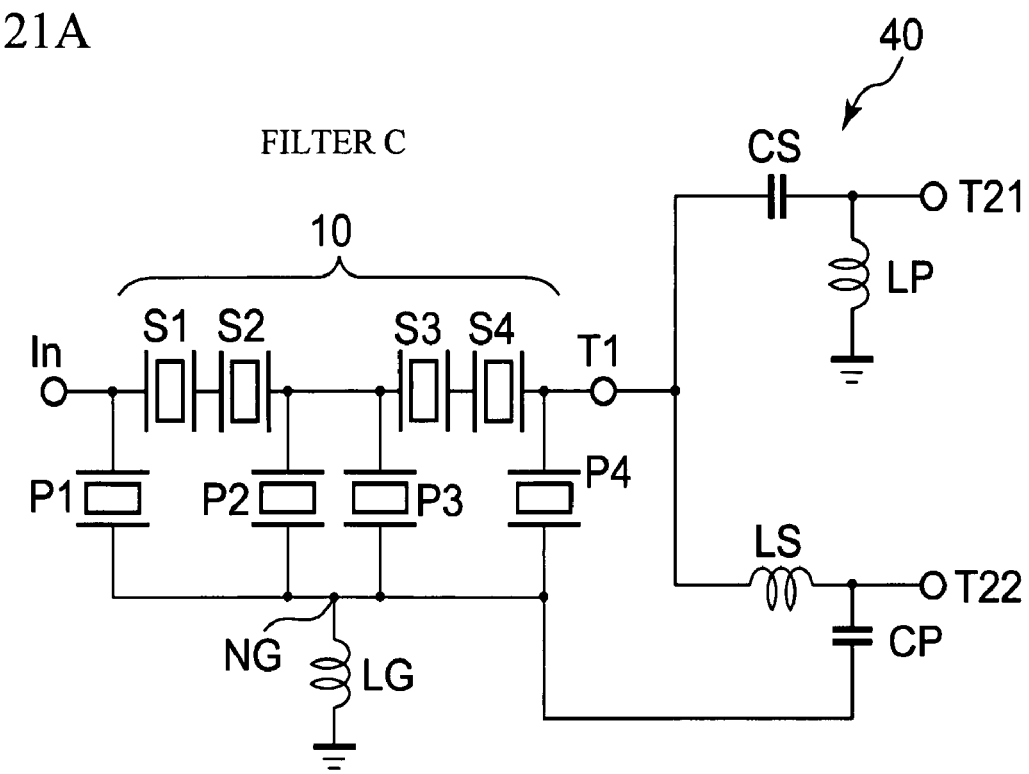
FIGS. 21A and 21B are circuit diagrams of a filter C and a filter D in accordance with the second embodiment.
Figure 21B:
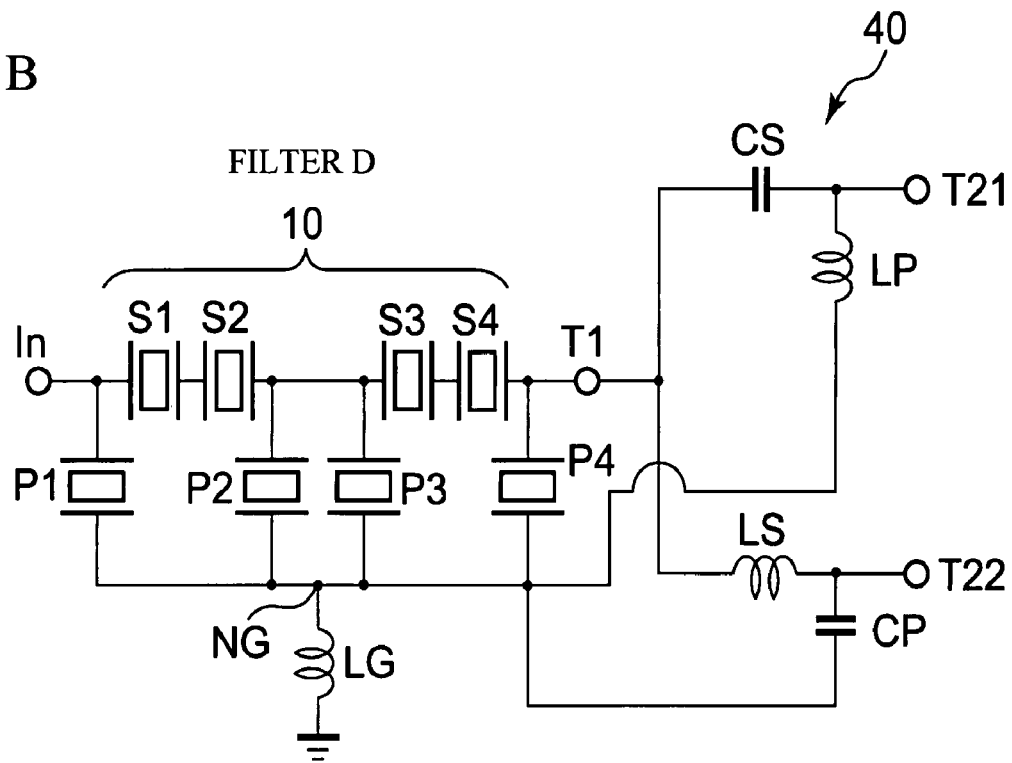

The bandpass characteristics, the amplitude balance, and the phase balance of four filters A through D shown in FIGS. 20A through 21B were calculated in a second embodiment of the present invention. FIG. 20A is a circuit diagram of the filter A. Unlike the filter shown in FIG. 17, the filter A has the ground sides of the parallel-arm resonators P1 through P4 of the ladder filter 10 connected to a common node NG, and a ground inductor LG connected between the common node NG and the ground. The other aspects of this structure are the same as those of the structure shown in FIG. 17, and explanation of them is omitted here. FIG. 20B is a circuit diagram of the filter B. Unlike the filter A, the filter B has the ground side of the first inductor LP of the balun 40 connected to the common node NG and grounded via the ground inductor LG. FIG. 21A is a circuit diagram of the filter C. Unlike the filter A, the filter C has the ground side of the second capacitor CP of the balun 40 connected to the common node NG and grounded via the ground inductor LG. FIG. 21B is a circuit diagram of the filter D. Unlike the filter A, the filter D has the ground sides of the first inductor LP and the second capacitor CP of the balun 40 connected to the common node and grounded via the ground inductor LG.

Figure 22A:
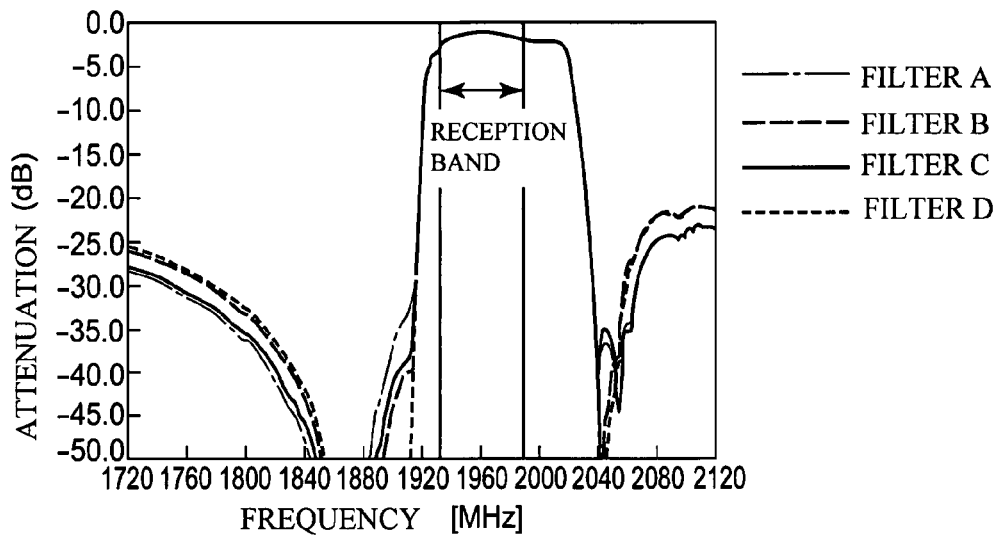
FIGS. 22A through 22C show the bandpass characteristics and the balance characteristics of the filters A through D.
Figure 22B:
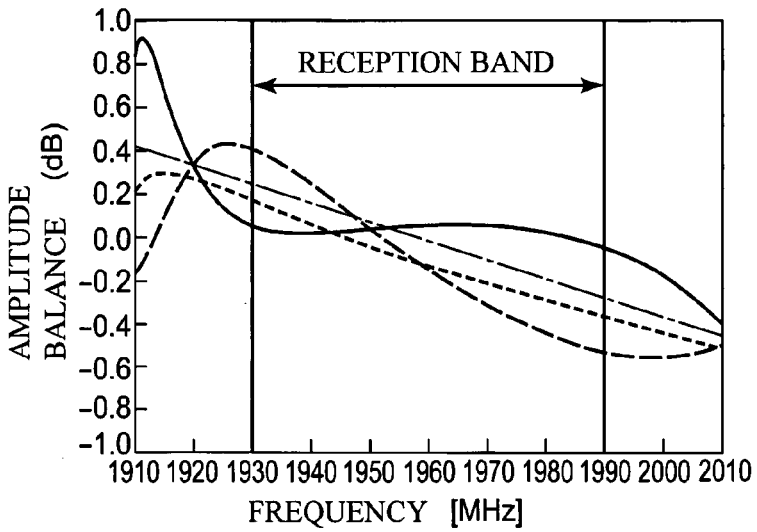
Figure 22C:
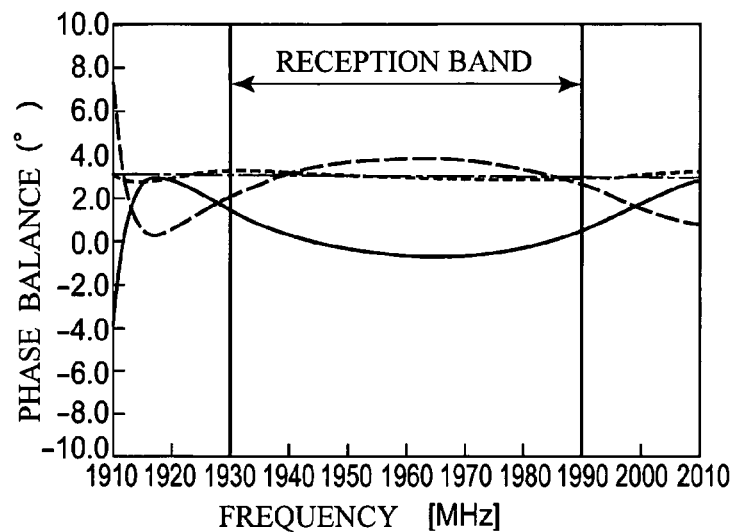

FIGS. 22A through 22C show the bandpass characteristics, the amplitude balance, and the phase balance of each of the filters A through D. As can be seen from FIG. 22A, the bandpass characteristics do not greatly vary among the filters A through D. As can be seen from FIG. 22B, the filter C has a much better amplitude balance than the other three filters. For example, the amplitude balance of the filter A is ±0.3 dB within the reception band, while the amplitude balance of the filter C is ±0.1 dB. As can be seen from FIG. 22C, the phase balance of the filter A is 180 degrees ±3 degrees within the reception band, while the phase balance of the filter C is 180 degrees ±1.5 degrees.

In accordance with the second embodiment, the ground inductor LG is provided between the ground and the common node NG of the ground terminal of the filter 10 and at least one ground terminal of the balun 40 that has two or more ground terminals. With this arrangement, the amplitude balance and the phase balance can be improved.

Particularly, in a case where, among the ground terminals of the balun 40 that has two or more ground terminals, the ground terminal connected to the node common with the ground terminal of the filter 10 is the terminal on the ground side of the second capacitor. CP, the amplitude balance and the phase balance can be greatly improved.

Third Embodiment

Figure 23A:
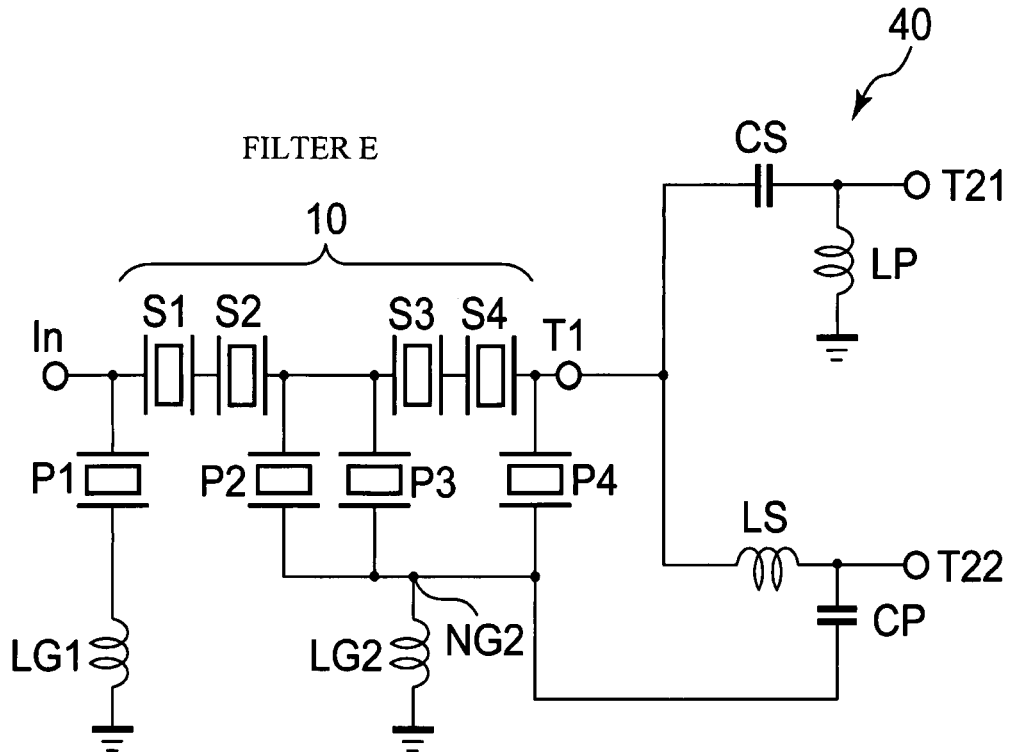
FIGS. 23A and 23B are circuit diagrams of a filter E and a filter F in accordance with a third embodiment of the present invention.

A third embodiment of the present invention is an example case where the ground terminals of the parallel-arm resonators P1 through P4 of the ladder filter 10 are divided into two groups connected to two ground inductors. As shown in FIG. 23A, in a filter E, the parallel-arm resonator P1 of the ladder filter 10 is connected to the ground via a ground inductor LG1, the parallel-arm resonators P2 through P4 are connected to a common node NG2, and a ground inductor LG2 is connected between the node NG2 and the ground. The ground side of the second capacitor CP of the balun 40 is also connected to the node NG2.

Figure 23B:
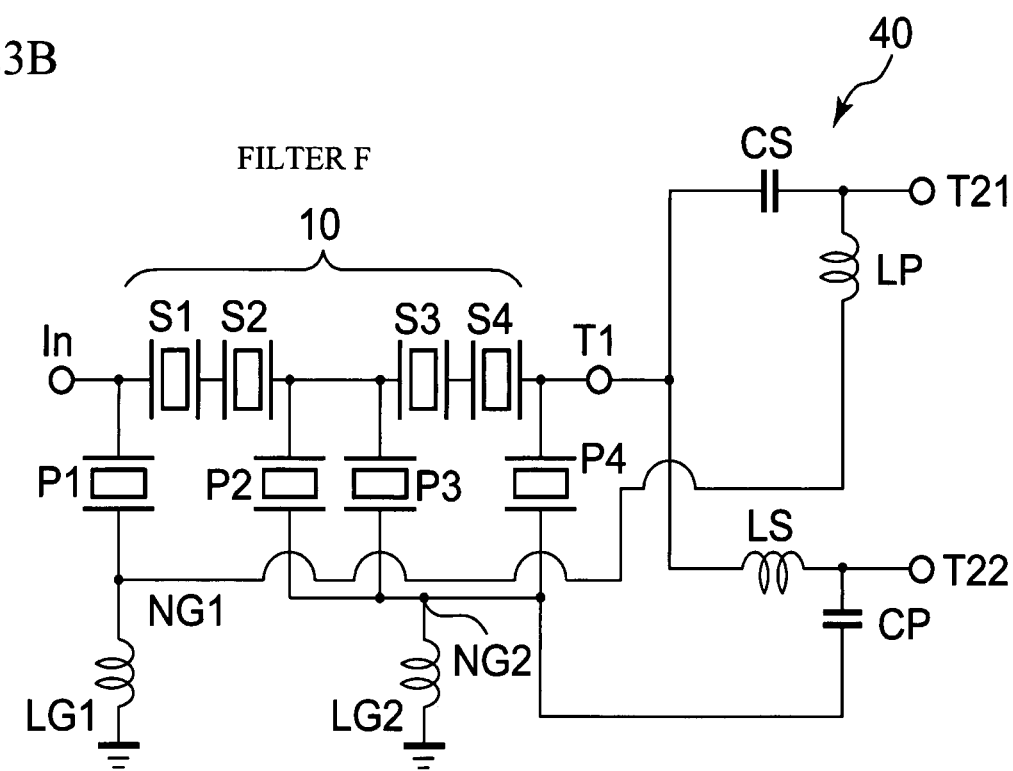

As shown in FIG. 23B, a filter F is the same as the filter E, except that the ground side of the first inductor of the balun 40 is connected to a node NG1 on the ground side of the parallel-arm resonator P1 of the filter 10, and is grounded via the ground inductor LG1.

Figure 24A:
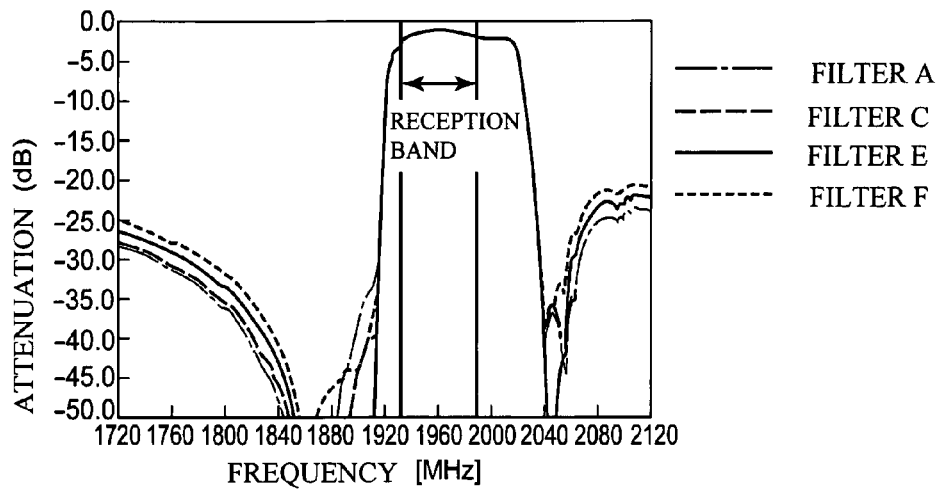
FIGS. 24A through 24C show the bandpass characteristics and the balance characteristics of the filters A, C, E, and F.
Figure 24B:
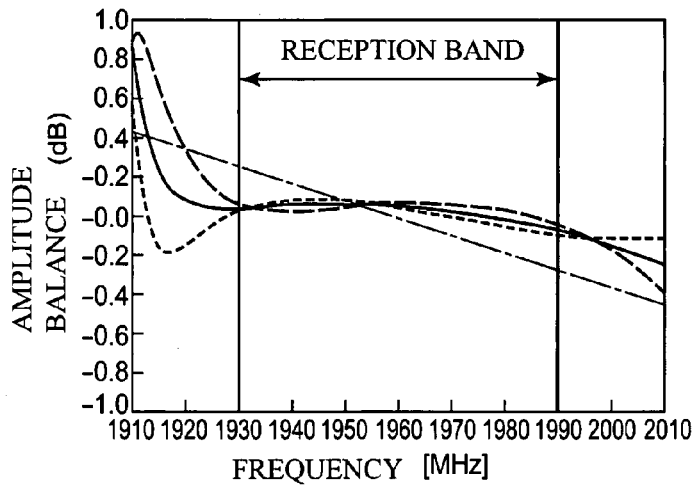
Figure 24C:
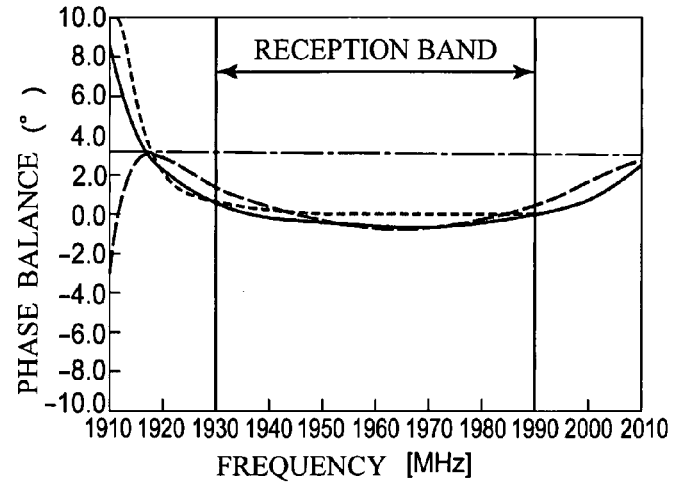

FIGS. 24A through 24C show the bandpass characteristics, the amplitude balance, and the phase balance of filters A, C, E, and F. As can be seen from FIG. 24A, the bandpass characteristics are substantially unvaried among the filters A, C, E, and F. As can be seen from FIG. 24B, the amplitude balance is substantially unvaried among the filters C, E, and F. As can be seen from FIG. 24C, the phase balance of the filter C in the reception band is 180 degrees ±1.5 degrees, while the phase balance of the filters E and F is 180 degrees ±1.0 degrees. Accordingly, the phase balance of the filters E and F is improved.

In the filter C of the second embodiment, the ground terminals of all the parallel-arm resonators P1 through P4 of the filter 10 are connected to a ground terminal of the balun 40. In the filter E of the third embodiment, however, the ground terminals of the parallel-arm resonators P2 through P4 of the parallel-arm resonators P1 through P4 of the filter 10 are connected to at least one of the ground terminals of the balun 40, so as to improve the phase balance. More specifically, the ground terminals of the parallel-arm resonators P2 through P4 of the filter 10 are connected to the ground inductor LG2 to which the ground side of the second capacitor CP is also connected, and the ground terminal of the parallel-arm resonator P1 of the filter 10 is not connected to the ground side of the balun 40 but is connected to the ground inductor LG1. With this arrangement, the phase balance can be further improved.

As in the filter F, the ground terminals of the parallel-arm resonators P2 through P4 of the filter 10 are connected to the ground inductor LG2 to which the second capacitor CP is also connected, and the ground terminal of the parallel-arm resonator P1 of the filter 10 is connected to the ground inductor LG1 to which the first inductor LP is also connected. With this arrangement, the phase balance can be further improved.

Fourth Embodiment

Figure 25A:
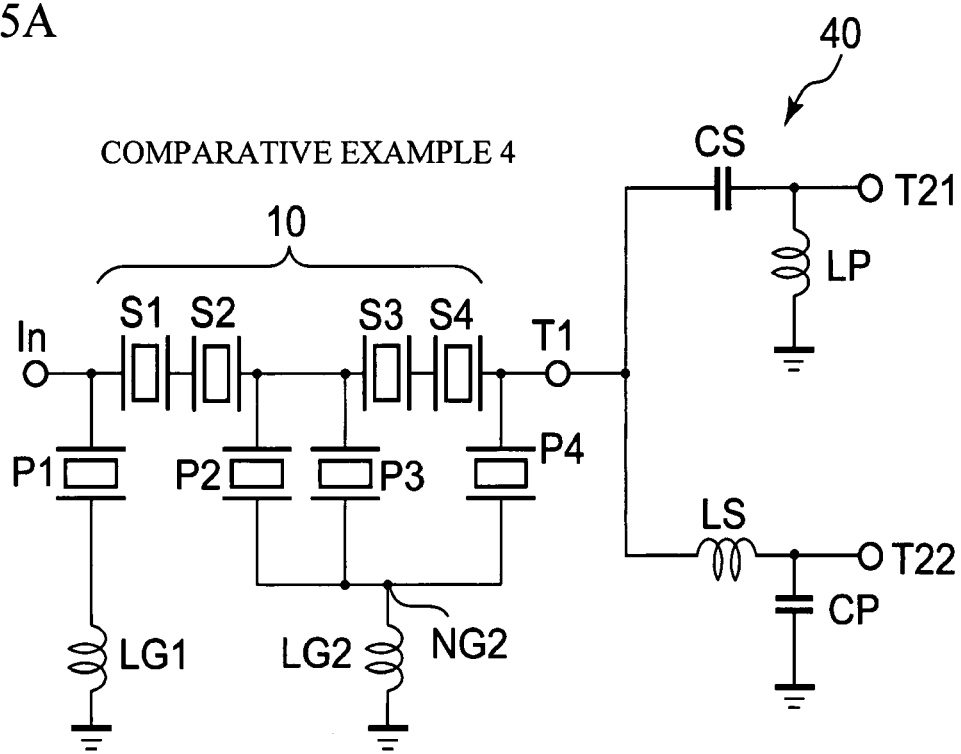
FIGS. 25A and 25B illustrate Comparative Example 4 and a fourth embodiment of the present invention.
Figure 25B:
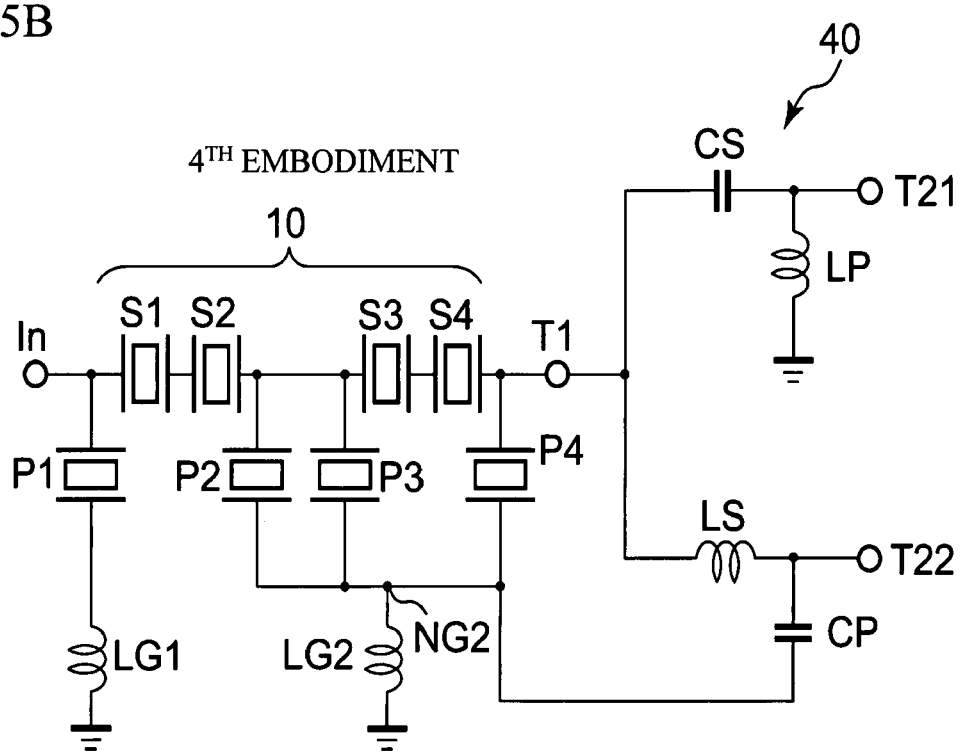

A fourth embodiment of the present invention is an example case where the filter E of the third embodiment is manufactured with the use of a stacked package. FIG. 25A is a circuit diagram of a filter as Comparative Example 4. The ground inductor LG1 is connected to the ground side of the parallel-arm resonator P1 of the ladder filter 10. The ground sides of the parallel-arm resonators P2 through P4 are connected to the common ground node NG2, and the ground inductor LG2 is connected between the common node NG and the ground. The ground terminals of the balun 40 are grounded independently of the ground terminals of the filter 10. FIG. 25B shows the same filter as the filter E shown in FIG. 23A, and explanation of the filter is omitted here.

Figure 26A:
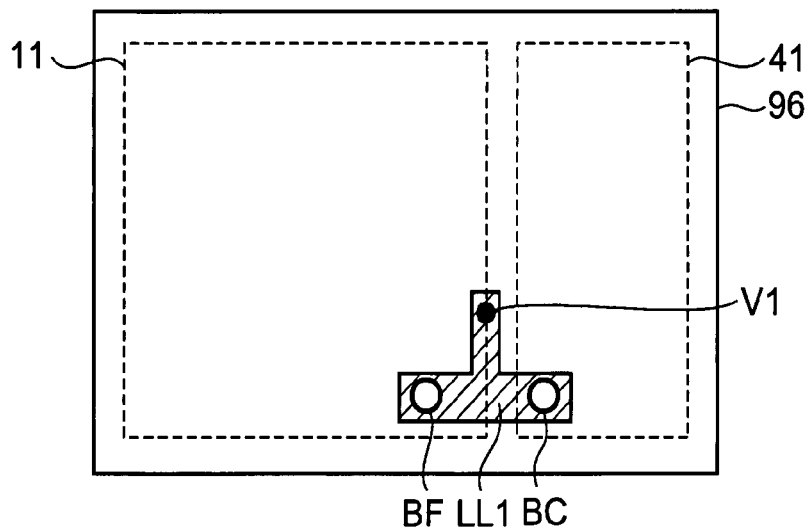
FIGS. 26A through 26C show an example case where a filter in accordance with the fourth embodiment is mounted in a stacked package.
Figure 26B:
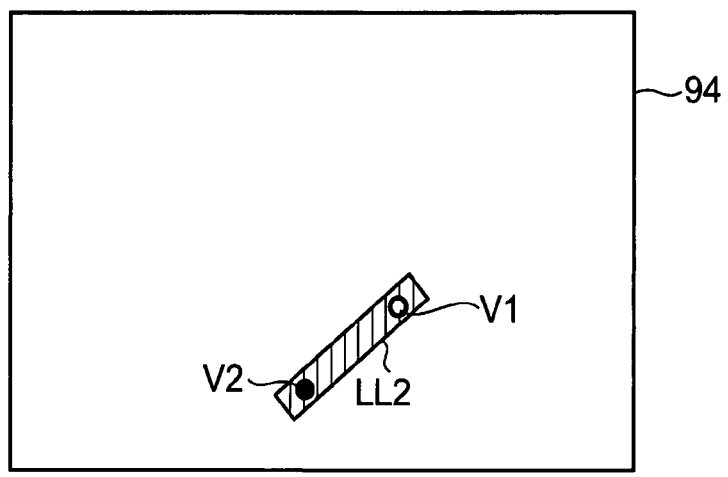
Figure 26C:
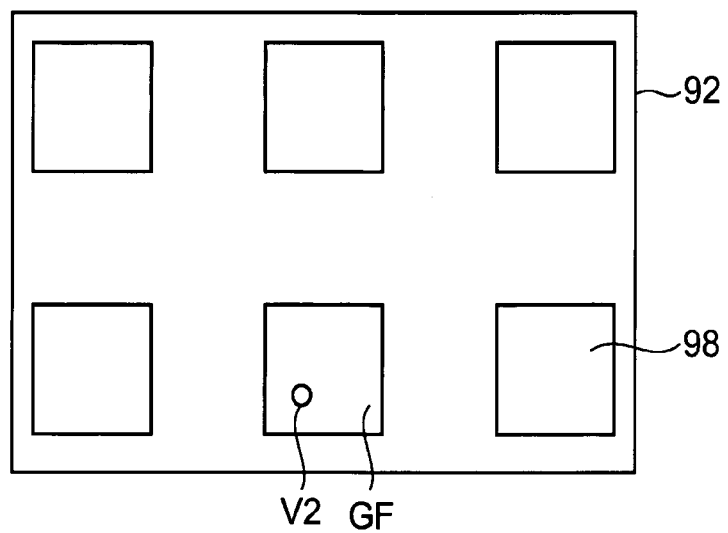

FIGS. 26A through 26C show the respective layers of the stacked package in which the filter is mounted in accordance with the fourth embodiment. FIG. 26A shows the surface of a die-attach layer 96 on which a chip is mounted. FIG. 26B shows the surface of an intermediate layer 94 below the die-attach layer 96. FIG. 26C shows a foot pad layer 92 that is the bottom face of the intermediate layer 94. Each of the layers is formed with an insulating material such as ceramics, and has a conductive pattern made of copper or the like and a via penetrating the layer and filled with a conductive material. It should be noted that the via formed in each layer is indicated by the black dots, and the regions to which the via of one layer above is indicated by the white dots. As shown in FIG. 26A, the filter chip 11 and the balun chip 41 are flip-chip mounted on the die-attach layer 96. The node NG2 of the filter chip 11 is connected to a bump pad BF with a bump. The ground side of the second capacitor CP of the balun chip 41 is connected to a bump pad BC with a bump. The bump pads BF and BC are connected to each other with a line pattern LL1, and are connected to a line pattern LL2 of the intermediate layer 94 via a via V1. The line pattern LL2 functions as the ground inductor LG2. The line pattern LL2 is connected to a ground food pad GF that is a ground terminal formed on the foot pad layer 92. With the above arrangement, the ground terminal of the second capacitor CP of the balun 40 and a ground terminal of the filter 10 are connected to the ground via the ground inductor LG2. The filter of Comparative Example 4 shown in FIG. 25A is also mounted in a stacked package.

Figure 27A:
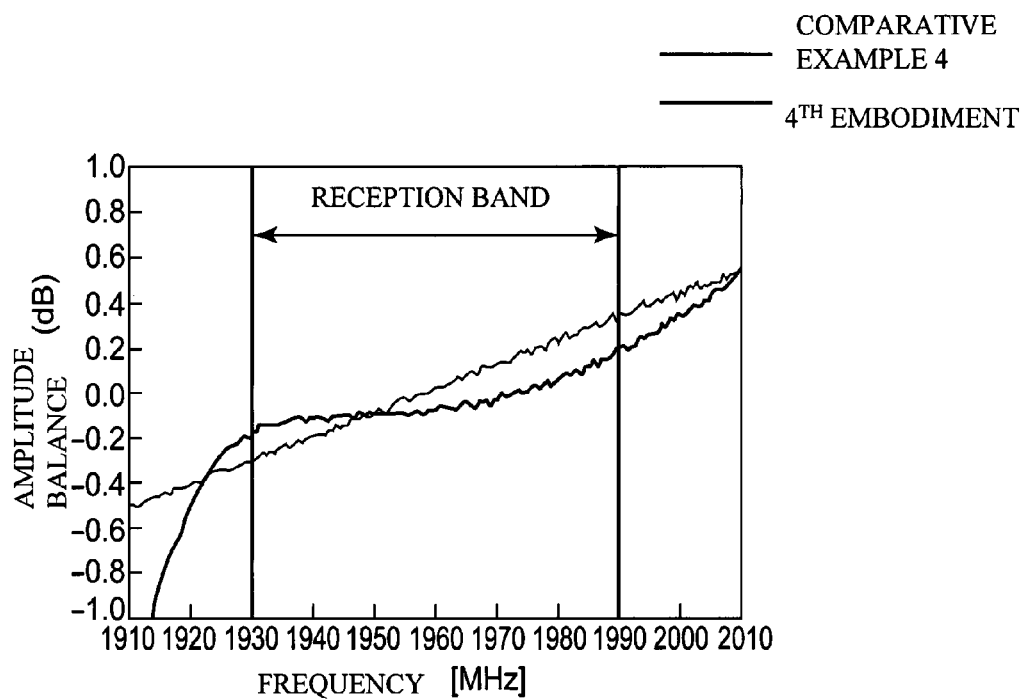
FIGS. 27A and 27B show the results of measurement of the balance characteristics of Comparative Example 4 and the fourth embodiment.
Figure 27B:
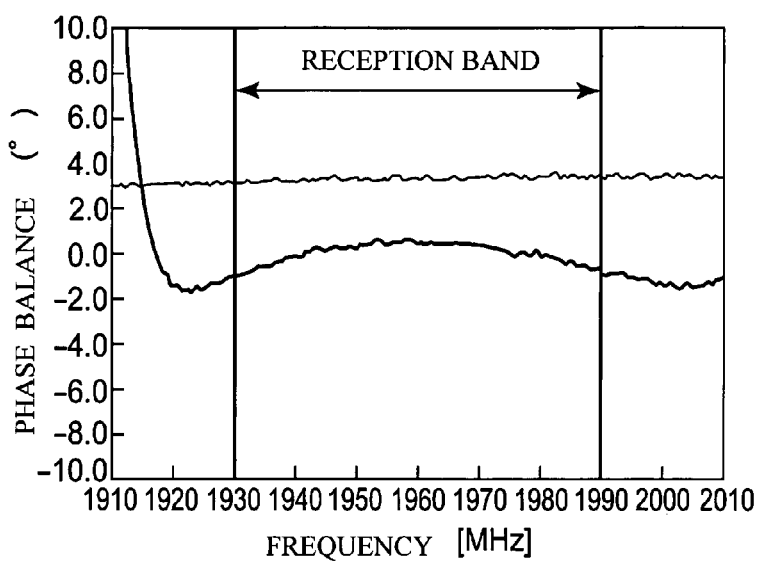

FIGS. 27A and 27B show the amplitude balances and the phase balances of Comparative Example 4 shown in FIG. 25A and the fourth embodiment shown in FIG. 25B. As shown in FIG. 27A, the amplitude balance of the fourth embodiment is ±(0.15 to 0.2), which is better than the amplitude balance of Comparative Example 4, which is ±0.3 dB. As shown in FIG. 27B, the phase balance of the fourth embodiment is 180 degrees ±0.5 degrees, which is better than the phase balance of Comparative Example 4, which is 180 degrees ±3 degrees. Like the calculation results shown in FIGS. 24A through 24C, the results of this experiment show that the amplitude balance and the phase balance of the fourth embodiment (the filter E of the third embodiment) are better.

Fifth Embodiment

Figure 28:
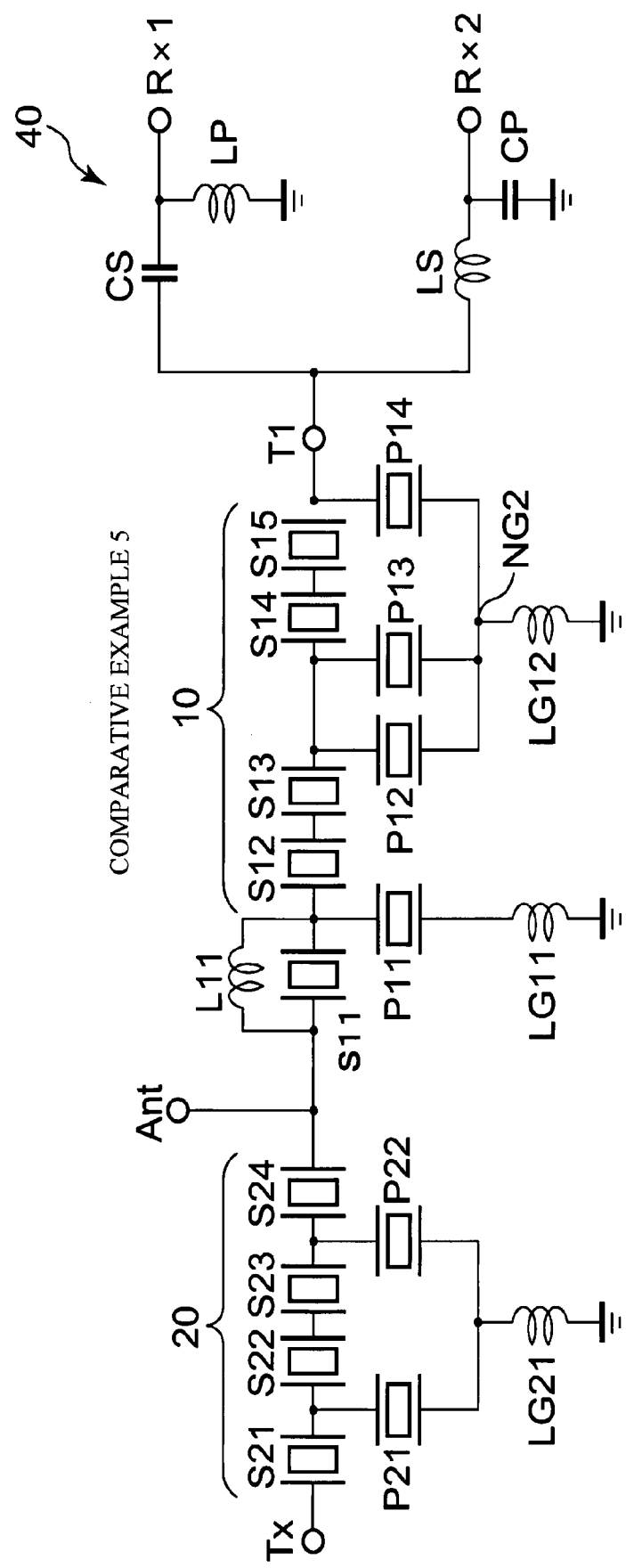
FIG. 28 is a circuit diagram of a duplexer in accordance with Comparative Example 5.

A fifth embodiment of the present invention is an example case where the filter of the fourth embodiment is employed in a duplexer. FIG. 28 is a circuit diagram of a duplexer of Comparative Example 5. In this duplexer, the reception filter 10 that has series-arm resonators S11 through S15 are connected in series and parallel arm resonators P11 through P14 are connected in parallel is connected between a common terminal Ant and an unbalanced terminal T1. An inductor L11 is connected in parallel to the series-arm resonator S11 closest to the common terminal Ant of the reception filter 10. A ground inductor LG11 is connected between the ground terminal of the parallel-arm resonator P11 and the ground. The ground terminals of the parallel-arm resonators P12 through P14 are connected to one another with a node NG2. A ground inductor LG12 is connected between the node NG2 and the ground. The inductance of the inductor L11 and the ground inductors LG11 and LG12 is set so that an attenuation pole is formed in the transmission band. The balun 40 shown in FIG. 17 is connected to the unbalanced terminal T1, and the two balanced terminals of the balun 40 serve as a reception terminal 1 Rx1 and a reception terminal 2 Rx2, respectively. A signal of the reception band that is input through the common terminal Ant passes through the reception filter 10, and signals processed by the balun 40 so as to have the opposite phases to each other are output from the reception terminals Rx1 and Rx2.

Meanwhile, the transmission filter 20 is connected between the common terminal Ant and a transmission terminal Tx. The transmission filter 20 is a ladder filter that includes series-arm resonators S21 through S24 and parallel-arm resonators P21 and P22. A signal of the transmission band that is input through the transmission terminal Tx passes through the transmission filter 20, and is output from the common terminal Ant. At the frequencies in the transmission band, the input impedance of the reception filter 10 is large due to the presence of the series-arm resonator S11 and the inductor L11 of the reception filter 10. Thus, signals of the transmission band cannot enter into the reception filter 10.

Figure 29:
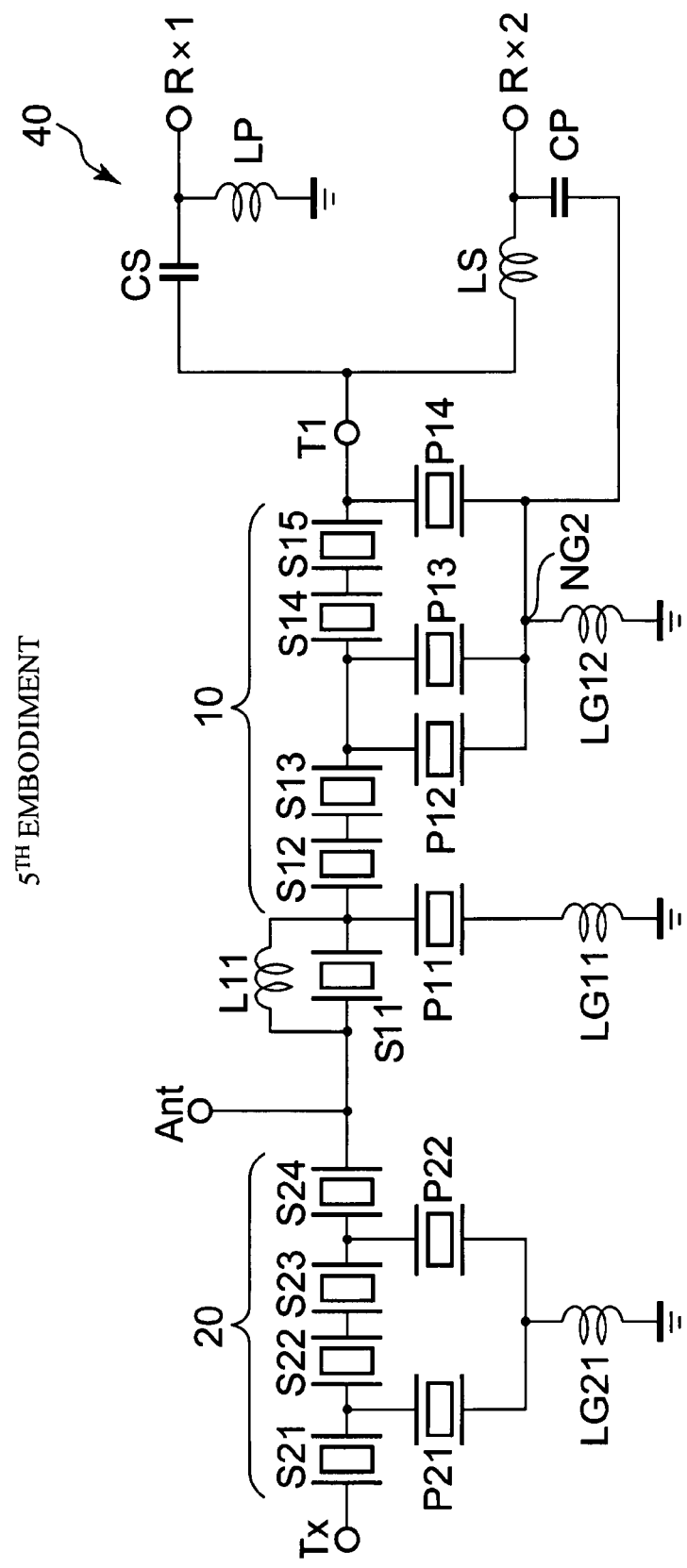
FIG. 29 is a circuit diagram of a duplexer in accordance with a fifth embodiment of the present invention.

FIG. 29 is a circuit diagram of the duplexer in accordance with the fifth embodiment. Unlike the duplexer shown in FIG. 28, the duplexer has the ground terminal of the second capacitor CP of the balun 40 connected to the node NG2. In other words, the ground terminal of the second capacitor CP of the balun 40 is connected to the ground inductor LG12 to which the ground terminals of some of the parallel-arm resonators of the reception filter 10 are also connected. The other aspects of the structure of this embodiment are the same as those of Comparative Example shown in FIG. 28, and explanation of them is omitted there.

Figure 30:
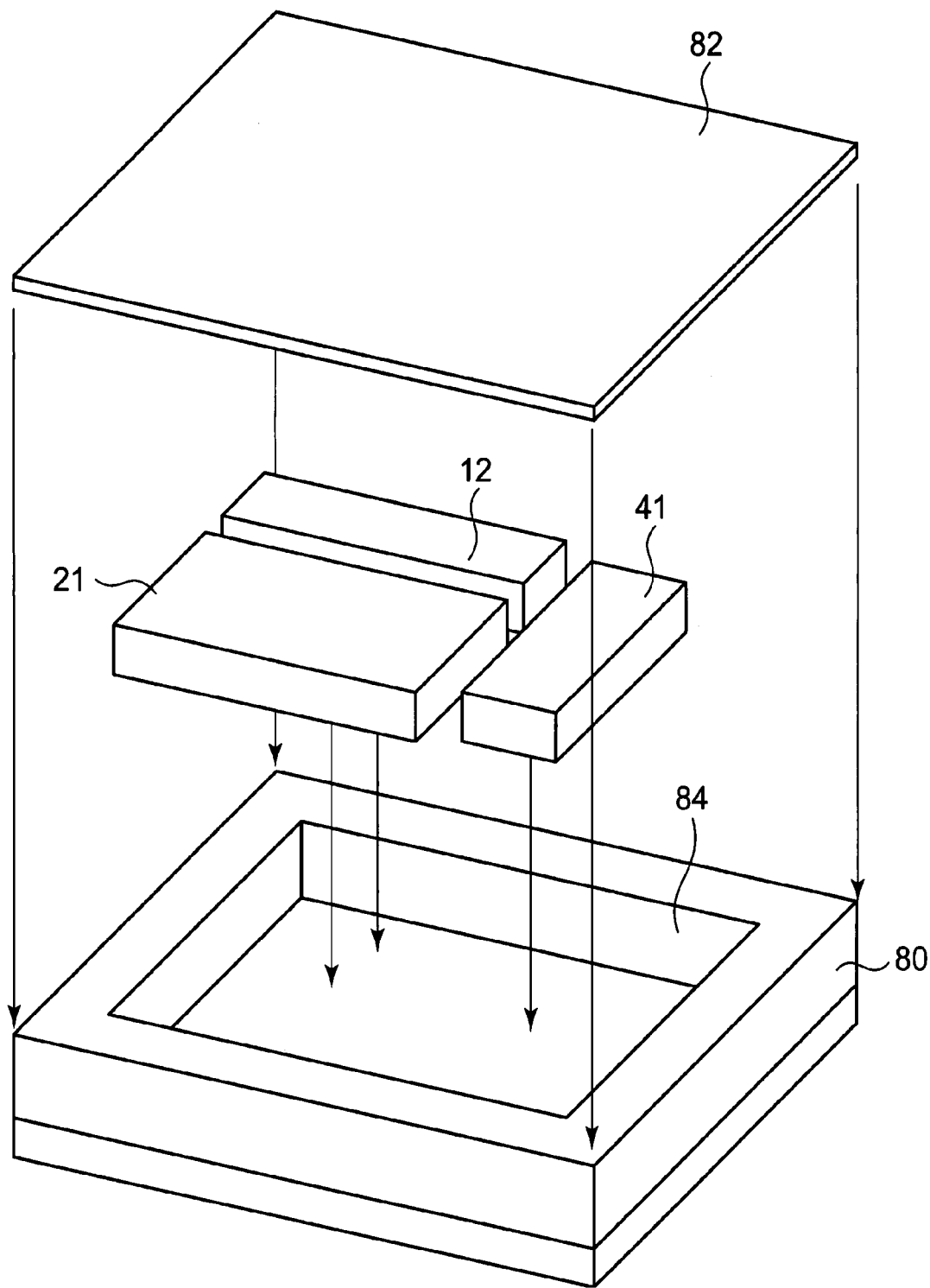
FIG. 30 illustrates an example case where a duplexer in accordance with the fifth embodiment is mounted in a stacked package.

FIG. 30 illustrates a structure in which the duplexer in accordance with the fifth embodiment is mounted in the stacked package 80. The filter chip 21 in which the reception filter 10 and the transmission filter 20 are formed, the balun chip 41 in which the balun is formed with an integrated passive device, and an inductor chip 12 in which the inductor L11 is formed are flip-chip mounted in the stacked package 80. The other aspects of this structure are the same as those shown in FIG. 18, and explanation of them is omitted here. The duplexer of Comparative Example 5 shown in FIG. 28 is also mounted in the stacked package 80.

Figure 31A:
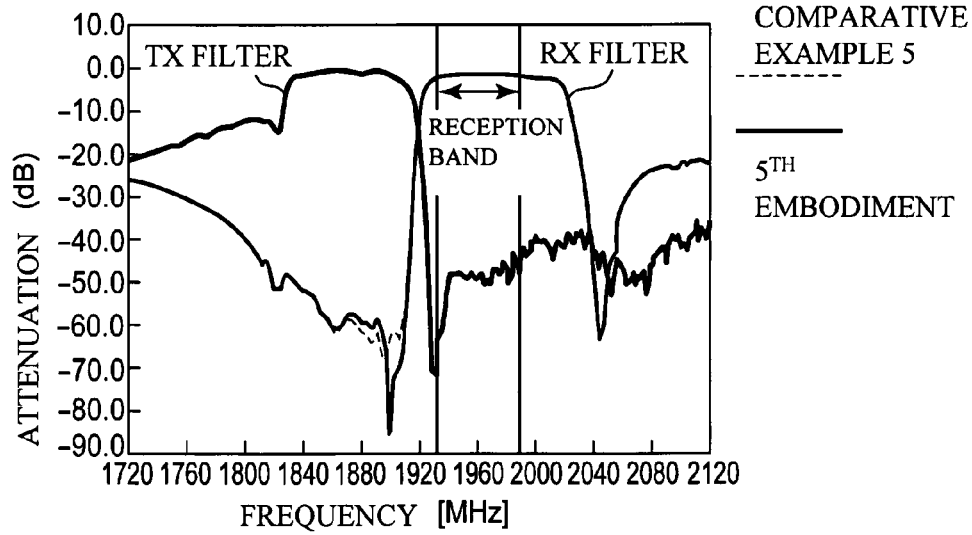
FIGS. 31A through 31C show the bandpass characteristics and the balance characteristics of Comparative Example 5 and the fifth embodiment.
Figure 31B:
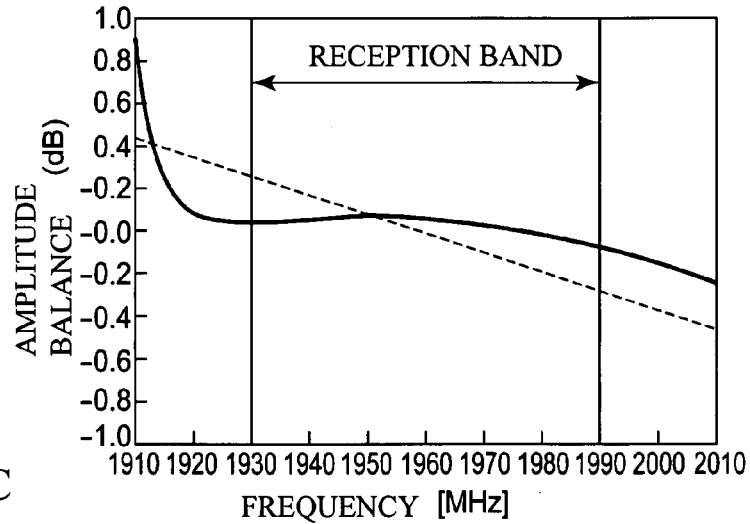
Figure 31C:
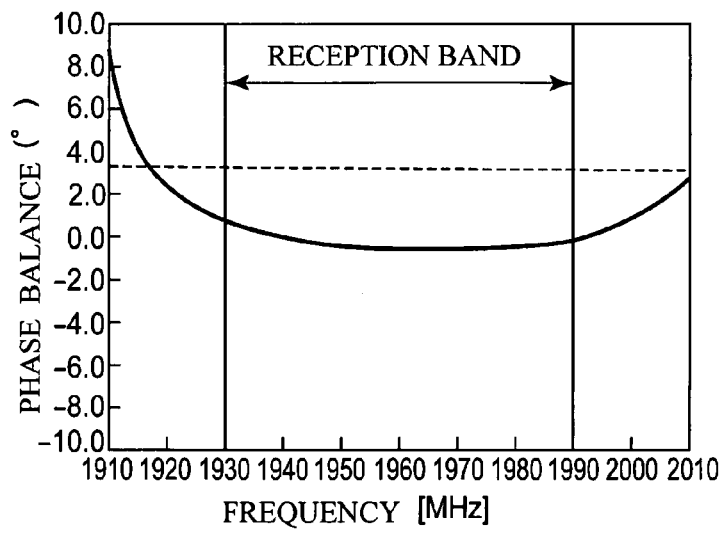

FIGS. 31A through 31C show the bandpass characteristics of the duplexers and the amplitude balances and the phase balances of the reception filters of Comparative Example 5 shown in FIG. 28 and the duplexer of the fifth embodiment shown in FIG. 29. As shown in FIG. 31A, the bandpass characteristics of Comparative Example 5 are substantially the same as the bandpass characteristics of the fifth embodiment. As shown in FIG. 31B, the amplitude balance of the fifth embodiment is ±(0.15 to 0.2), which is better than the amplitude balance of Comparative Example 5, which is ±0.3 dB. As shown in FIG. 31C, the phase balance of the fifth embodiment is 180 degrees ±0.5 degrees, which is better than the phase balance of Comparative Example 5, which is 180 degrees ±3 degrees. Accordingly, with the duplexer of the fifth embodiment, the amplitude balance and the phase balance can be improved.

Sixth Embodiment

Figure 32A:
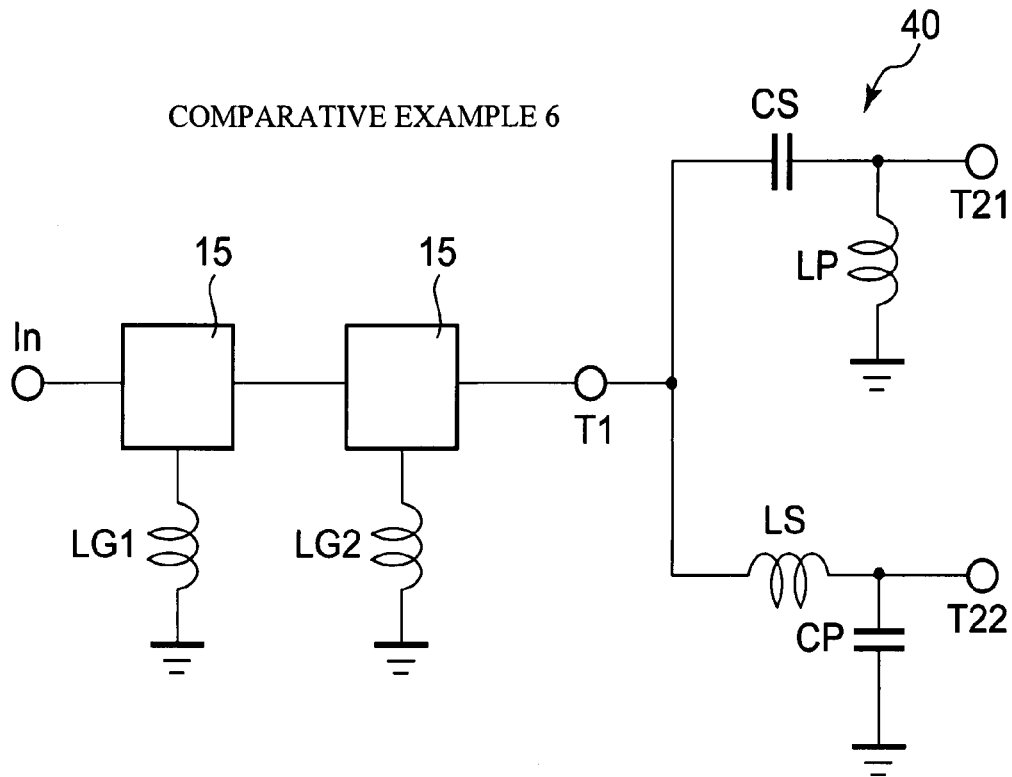
FIGS. 32A and 32B are circuit diagrams of filters in accordance with Comparative Example 6 and a sixth embodiment of the present invention.
Figure 32B:
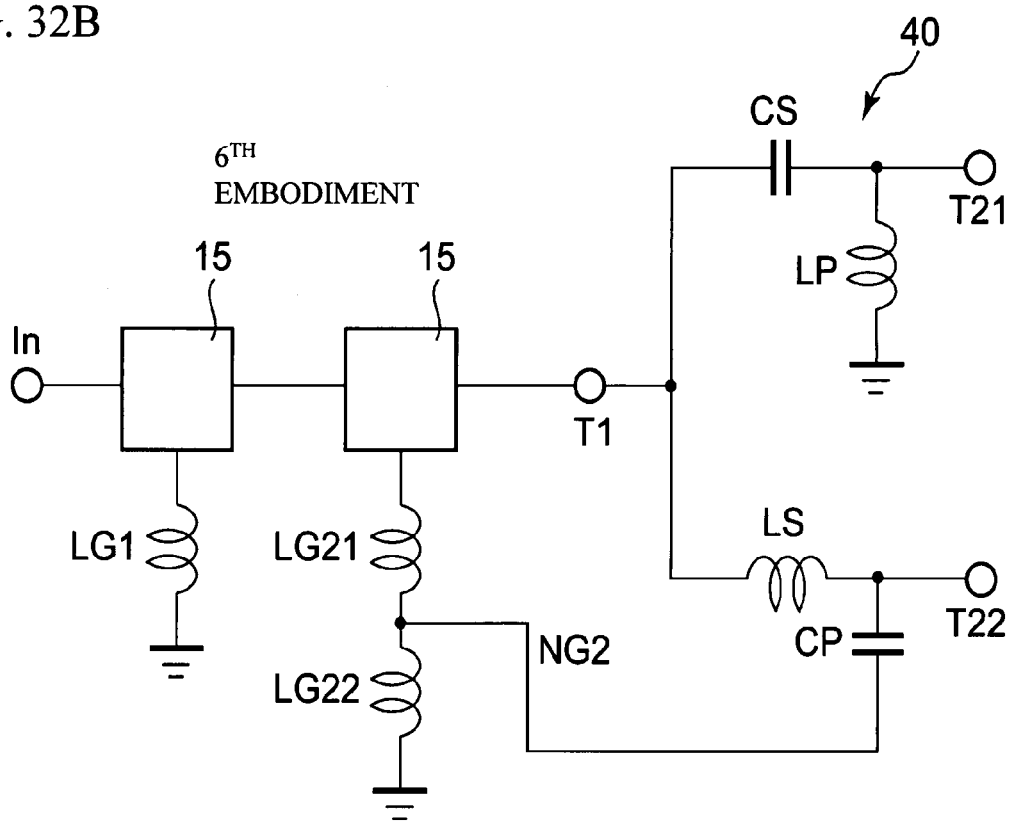

A sixth embodiment of the present invention is an example case where double-mode filters are employed as filters. FIG. 32A is a circuit diagram of a structure of Comparative Example 6, and FIG. 32B is a circuit diagram of a structure in accordance with the sixth embodiment. As shown in FIG. 32A, in Comparative Example 6, two double-mode filters 15 are connected in series between an input terminal In and an unbalanced terminal T1, and the double-mode filters 15 are connected to the ground via ground inductors LG1 and LG2, respectively. The balun 40 is connected to the unbalanced terminal T1, and differential signals are output through two balanced terminals T21 and T22. As shown in FIG. 32B, in the sixth embodiment, the ground side of the second capacitor CP of the balun 40 is connected to the ground side of a ground inductor LG21 (the third inductor) of one of the double-mode filters 15, and is connected to the ground via a ground inductor LG22. In other words, the ground inductor LG21 is connected between the node NG and the double-mode filter 15.

Figure 33:
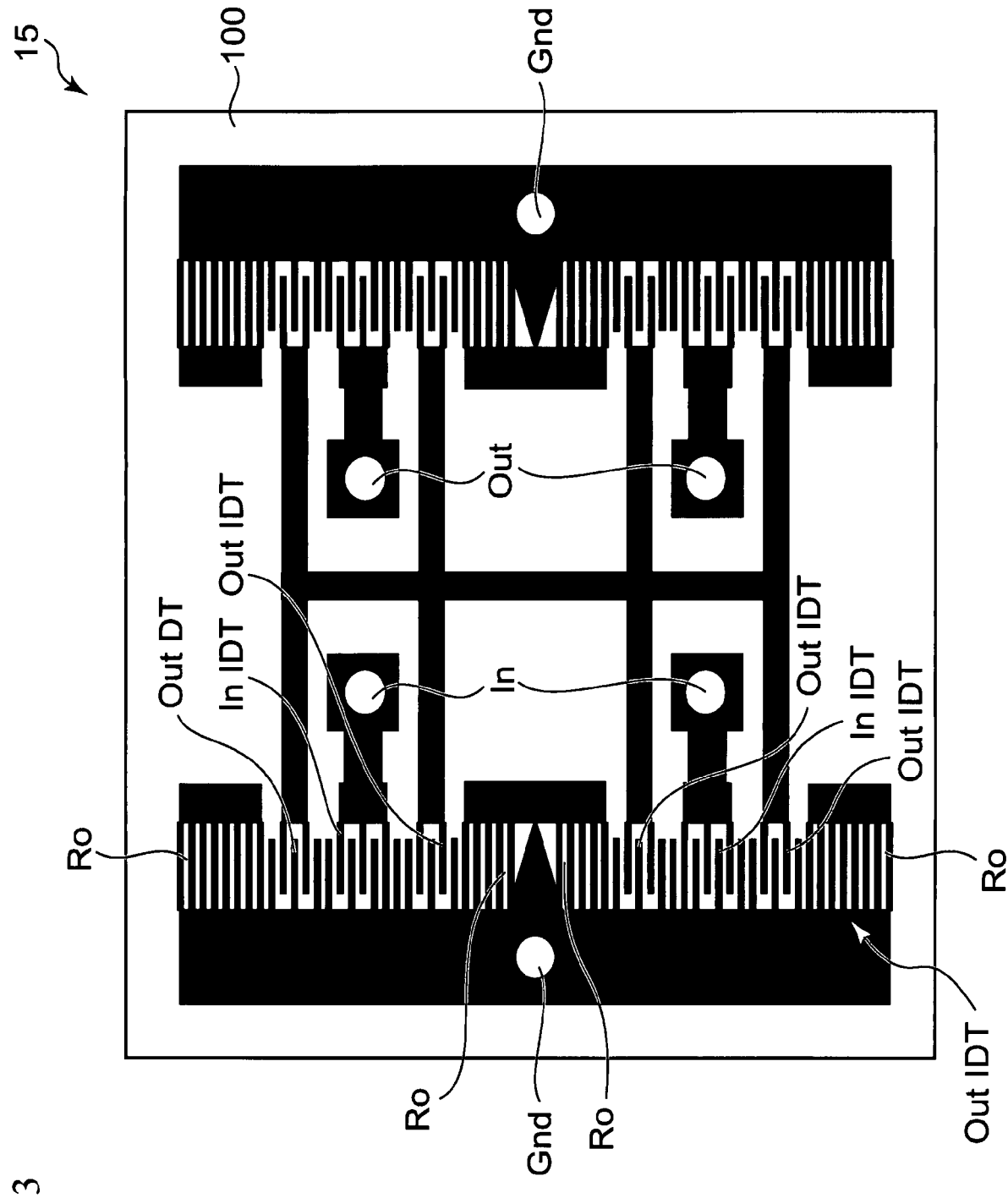
FIG. 33 is a plan view of a double-mode filter that is used in Comparative Example 6 and the sixth embodiment.

FIG. 33 illustrates the double-mode filter 15. Electrodes are formed with a metal film such as an aluminum film on a piezoelectric substrate 100. The solid-black pattern shown in FIG. 33 is the pattern on which the metal film is formed. Two output IDTs (Out IDT) are formed on both sides of each one input IDT (In IDT). Reflectors R0 are provided on both sides of each of the two outputs IDTs (Out IDT), so as to form one unit of the double-mode filter. In the structure shown in FIG. 33, two units are connected in parallel, and are also longitudinally connected to each other. The input terminals In, the output terminals Out, and the ground terminals Gnd are formed with bumps such as gold bumps or solder bumps.

Figure 34A:
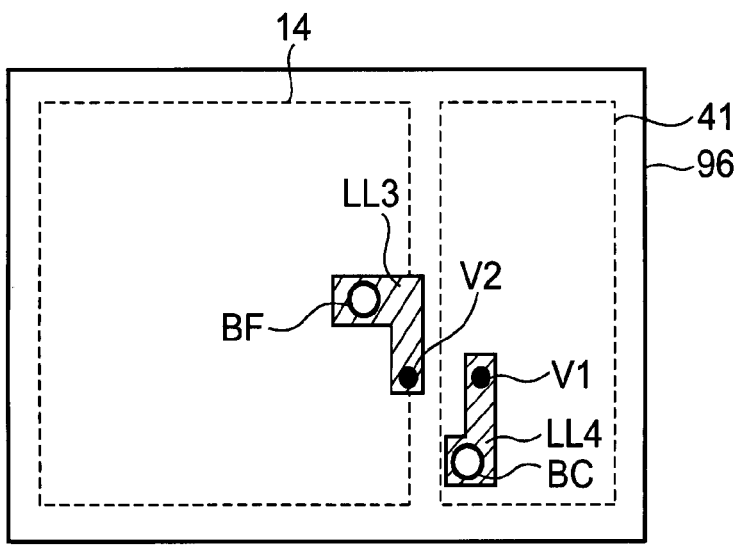
FIGS. 34A through 34C show example cases where a filter in accordance with the sixth embodiment is mounted in a stacked package.
Figure 34B:
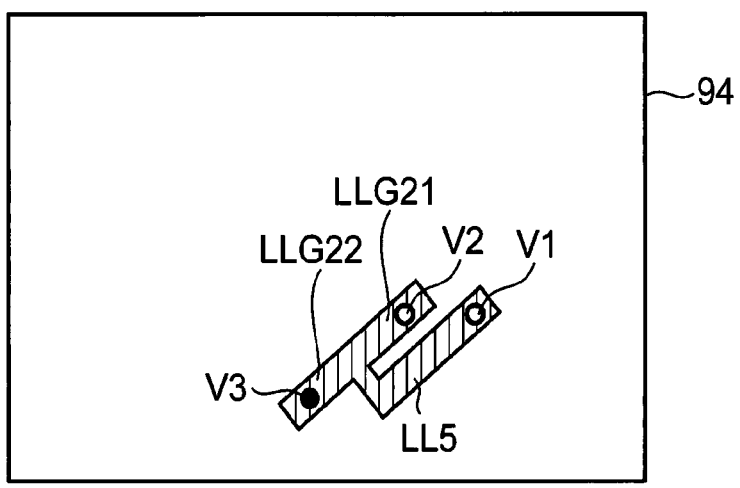
Figure 34C:
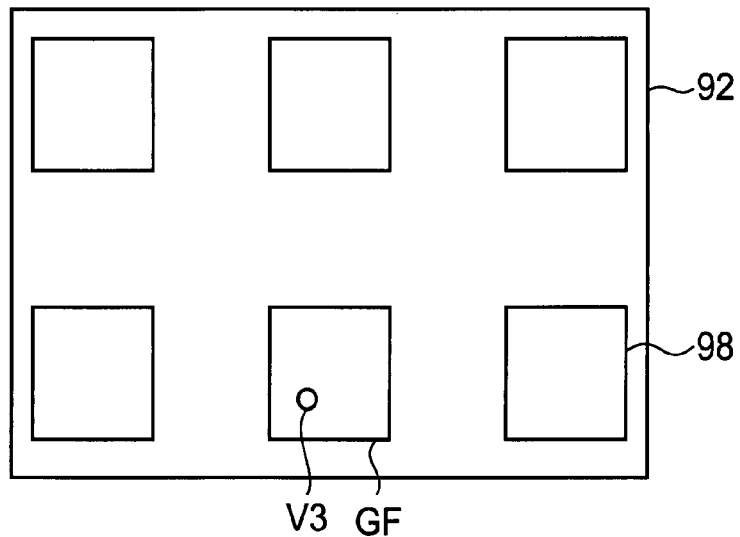

FIGS. 34A through 34C illustrate a stacked package. The respective layers are the same as those shown in FIGS. 26A through 26C. A filter chip 14 that has the two double-mode filters 15 formed therein, and the balun chip 41 that has the balun 40 formed therein are flip-chip mounted on the surface of the die-attach layer 96. The ground side of the second capacitor CP formed in the balun chip 41 is connected to a bump pad BC, and is connected to a line pattern LL5 of the intermediate layer 94 via a line pattern LL4 and a via V1. Meanwhile, the ground sides of the double-mode filters formed in the filter chip 14 are connected to a ground line pattern LLG21 of the intermediate layer 94 via a line pattern LL3 and a via V2. The line pattern LLG21 is connected to the line pattern LL5 connected to the second capacitor CP, so as to form a line pattern LLG22 connected to a ground food pad GF via a via V3. The line patterns LLG21 and LLG22 are equivalent to the ground inductors LG21 and LG22, respectively. With this arrangement, the second capacitor CP of the balun 40 and the ground inductor LG21 on the ground side of the double-mode filters are grounded via the ground inductor LG22. The filter of Comparative Example 6 shown in FIG. 32A is also mounted in a stacked package.

Figure 35A:
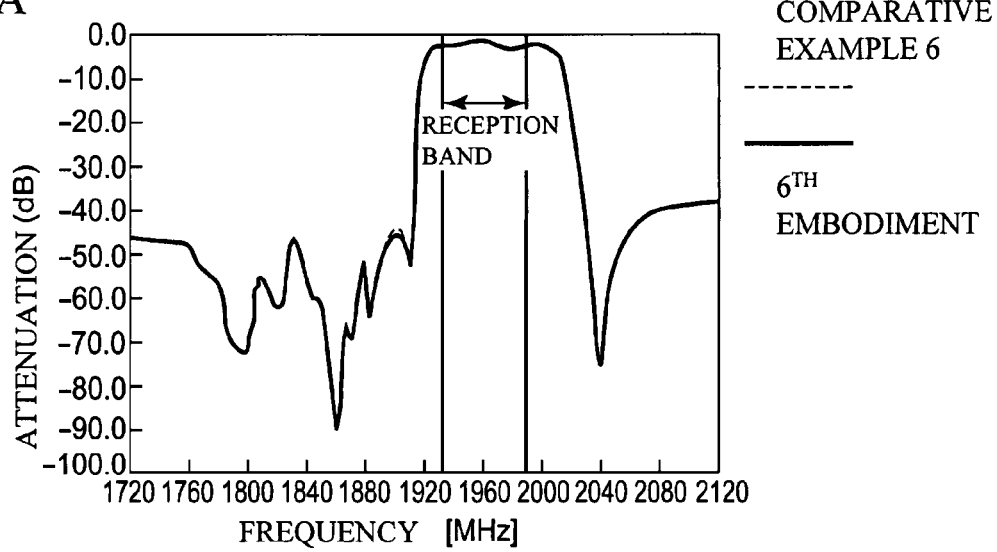
FIGS. 35A through 35C show the bandpass characteristics and the balance characteristics of Comparative Example 6 and the sixth embodiment.
Figure 35B:
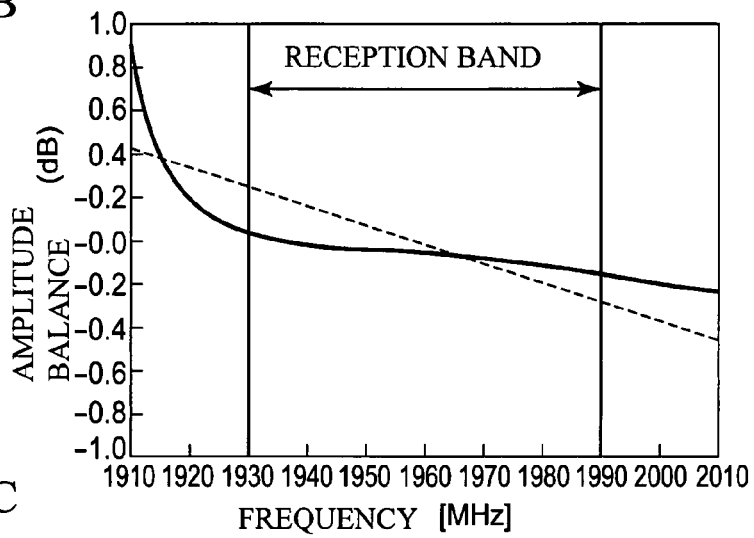
Figure 35C:
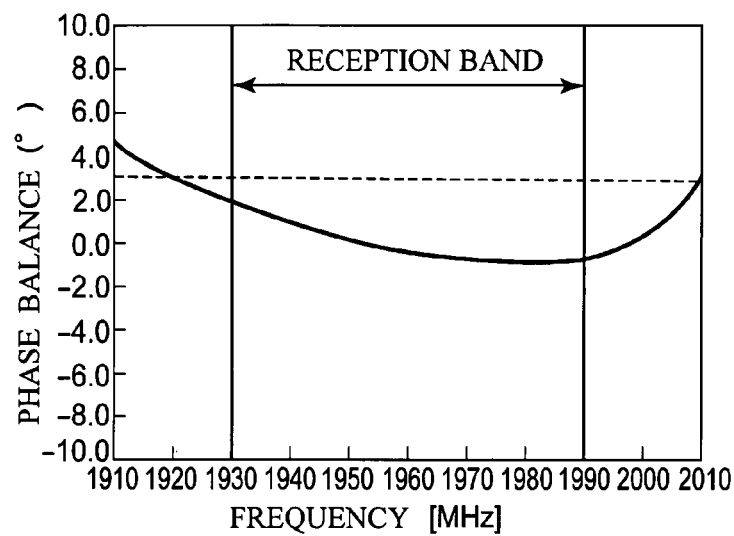

FIGS. 35A through 35C show the bandpass characteristics, the amplitude balances, and the phase balances of the filters of Comparative Example 6 shown in FIG. 32A and the sixth embodiment shown in FIG. 32B. As shown in FIG. 35A, the bandpass characteristics of Comparative Example 6 are substantially the same as the bandpass characteristics of the sixth embodiment. As shown in FIG. 35B, the amplitude balance of Comparative Example 6 is ±0.3 dB, while the amplitude balance of the sixth embodiment is reduced to ±0.1. As shown in FIG. 35C, the phase balance of the sixth embodiment is 180 degrees ±2 degrees, which is better than the phase balance of Comparative Example 6, which is 180 degrees ±3 degrees. Accordingly, with the filter of the sixth embodiment, the amplitude balance and the phase balance can be improved.

In accordance with the sixth embodiment, the effect of improving the balance characteristics by grounding the ground terminals of the filters and the ground terminal of the balun via the same ground inductor can be achieved not only with ladder filters but also with filters of any other type. It should be noted that the double-mode filters employed in this embodiment may be double-mode surface acoustic wave filters or double-mode boundary acoustic wave filters.

Seventh Embodiment

Figure 36:
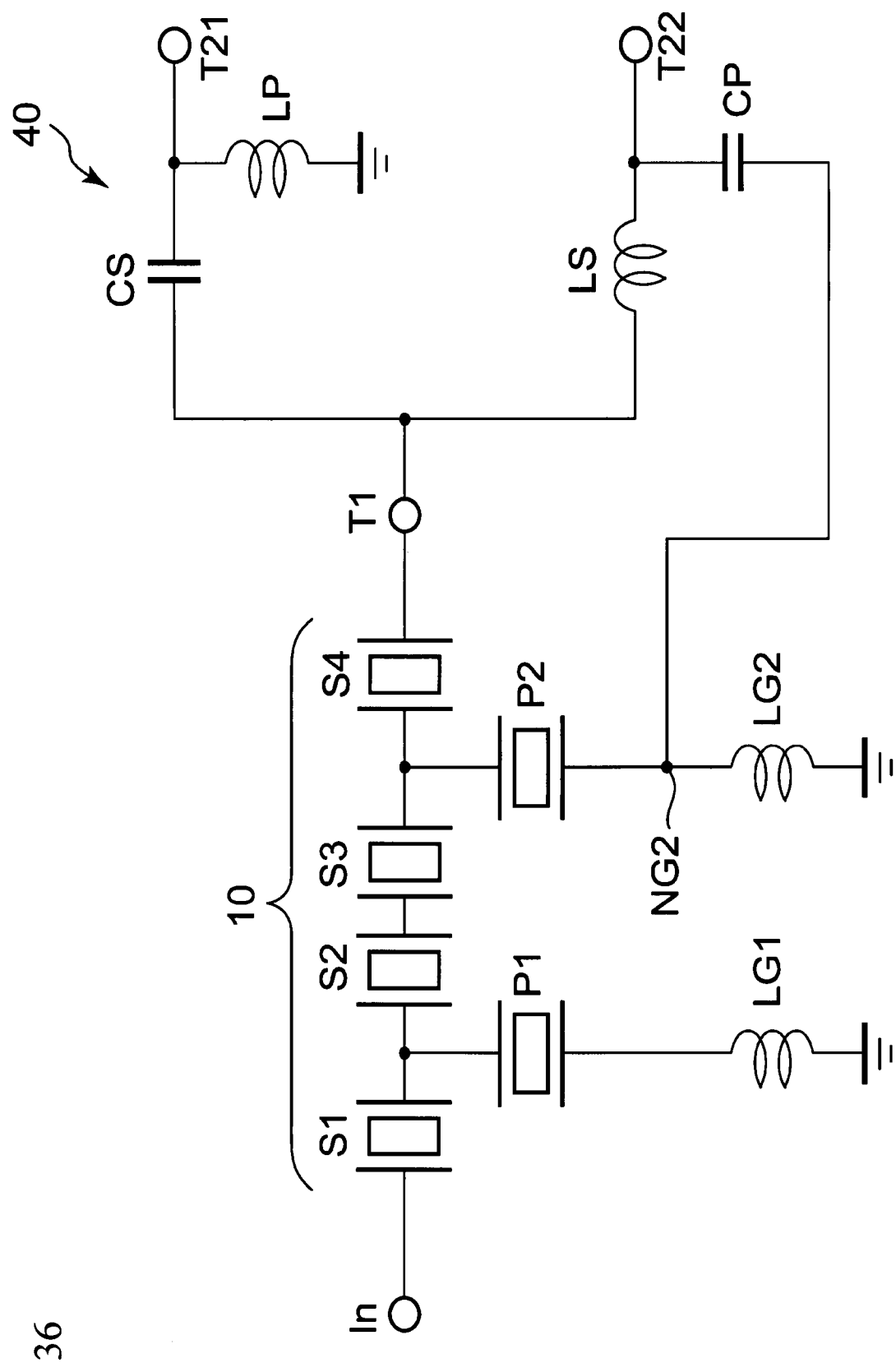
FIG. 36 is a circuit diagram of a filter in accordance with a seventh embodiment of the present invention.

A seventh embodiment of the present invention is an example case where resonators are employed as the inductors or the capacitors of the balun 40. FIG. 36 is a circuit diagram of a filter in accordance with the seventh embodiment. The ground side of a parallel-arm resonator P2 of the ladder filter 10 provided between an input terminal In and an unbalanced terminal T1 and the ground side of the second capacitor CP of the balun 40 are connected to each other with a common node NG2, and are grounded via a ground inductor LG2.

Figure 37:
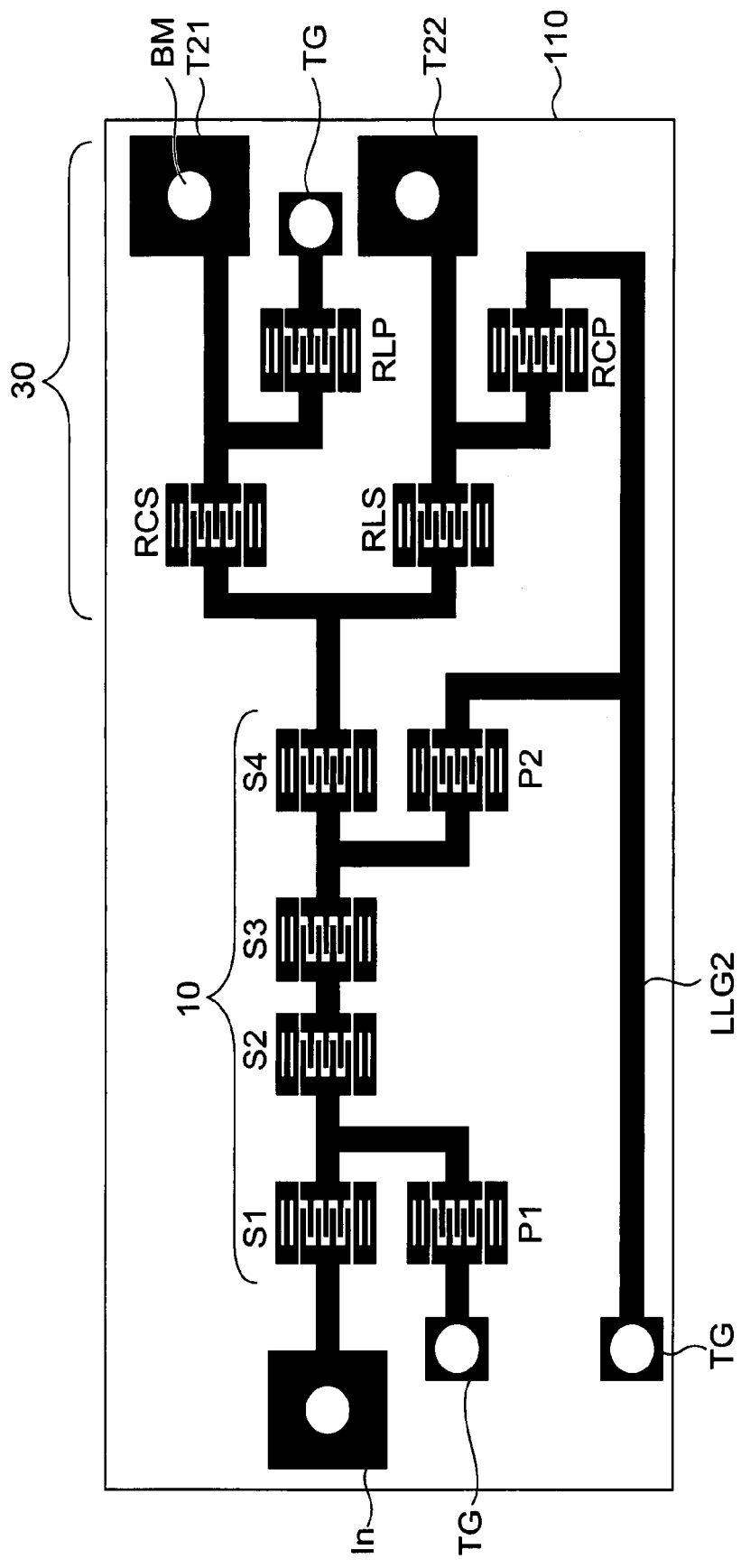
FIG. 37 is a plan view of a filter chip in accordance with the seventh embodiment.

FIG. 37 shows a structure in which the filter 10 in accordance with the seventh embodiment and the balun 40 are formed in one chip. The series-arm resonators S1 through S4 and the parallel-arm resonators P1 and P2 of the ladder filter 10 are formed with surface acoustic wave devices on a piezoelectric substrate 110. A resonator can be used as an inductor at frequencies between the resonance point and the antiresonance point. Accordingly, the inductors LP and LS of the balun 40 are formed with resonators RLP and RLS, respectively. A resonator can also be used as a capacitor at frequencies below the resonance point and above the antiresonance point. Accordingly, the capacitors CS and CP of the balun 40 are formed with resonators RCS and RCP. Here, the resonance frequency of the resonators RCS and RCP should be set outside the pass band. It is not necessary to provide reflectors R0 for those resonators. The ground side of the parallel-arm resonator P2 of the filter 10 and the ground side of the resonator RCP of the balun 40 are connected to each other, and are grounded to a ground bump TG via a line pattern LLG2 that is to serve as the ground inductor LG2. In this manner, resonators can be used as the inductors or the capacitors of the balun 40.

Eighth Embodiment

Figure 38:
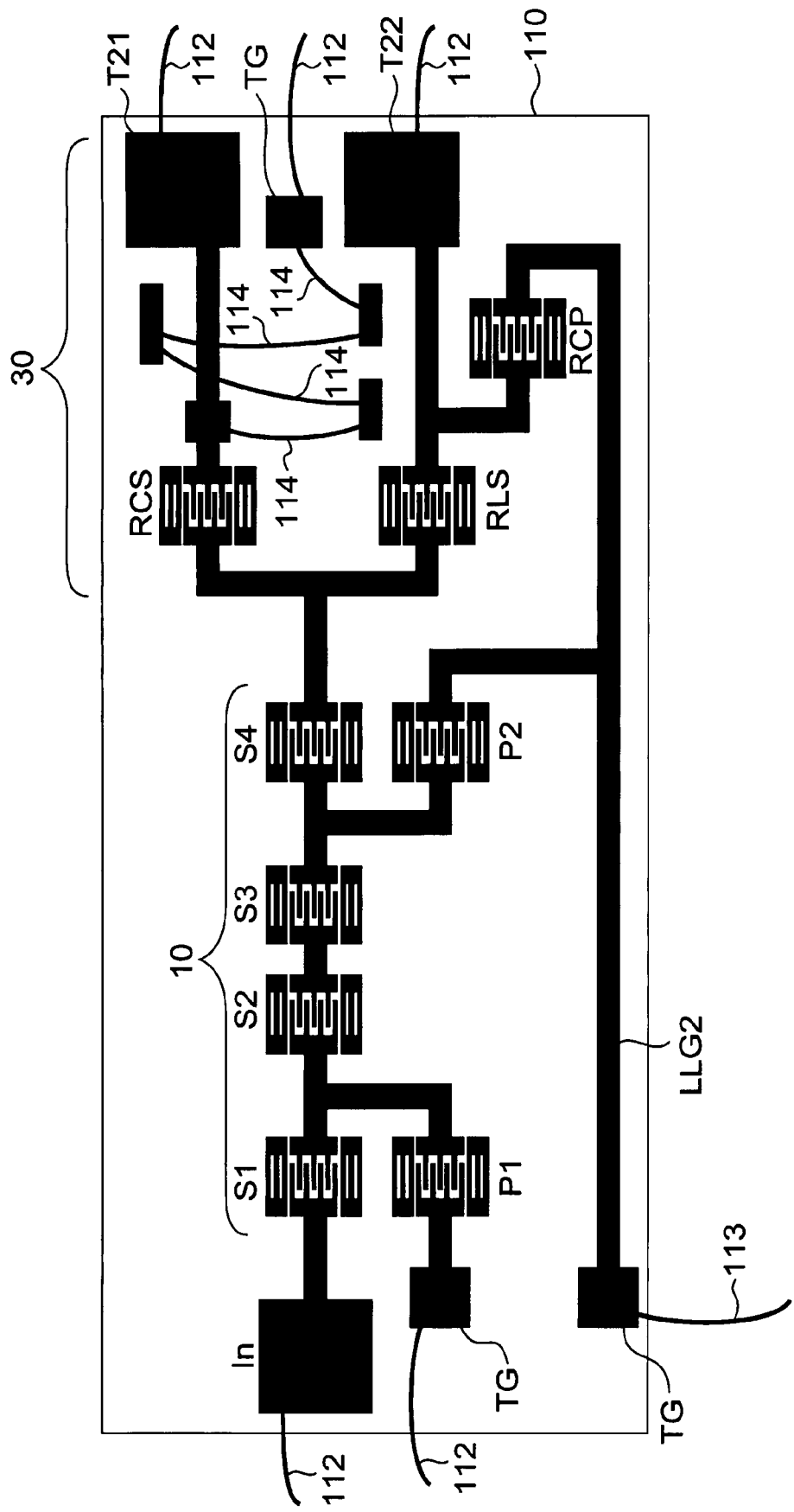
FIG. 38 is a plan view of a filter chip in accordance with an eighth embodiment of the present invention.

An eighth embodiment of the present invention is an example case where bonding wires are employed as an inductor of the balun 40. FIG. 38 illustrates the chip of the filter 10 in accordance with the eighth embodiment. Unlike the structure shown in FIG. 37, the filter 10 has bonding wires 114 as the first inductor LP of the balun. In this manner, bonding wires can be used as an inductor of the balun 40. Further, the ground inductor LG2 is formed with a line pattern LLG2 and bonding wires 113 on the chip.

Ninth Embodiment

Figure 39A:
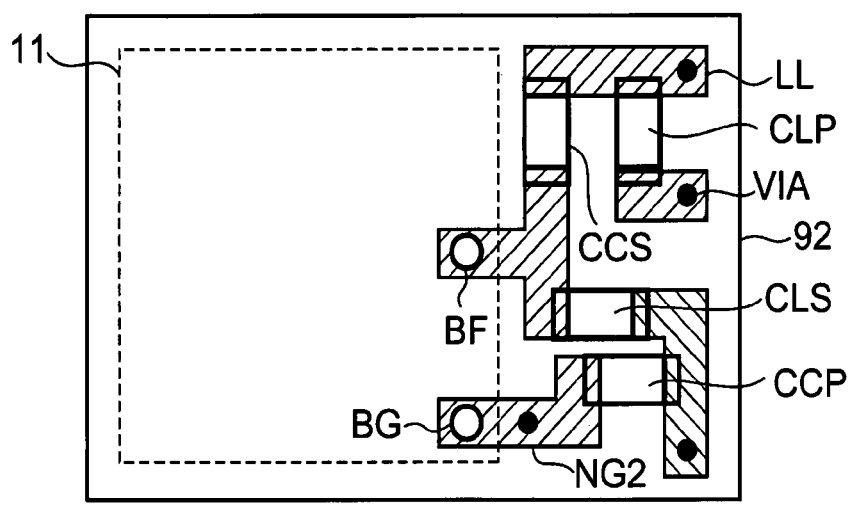
FIGS. 39A through 39C illustrate a stacked package in which a filter in accordance with the eighth embodiment is mounted.
Figure 39B:
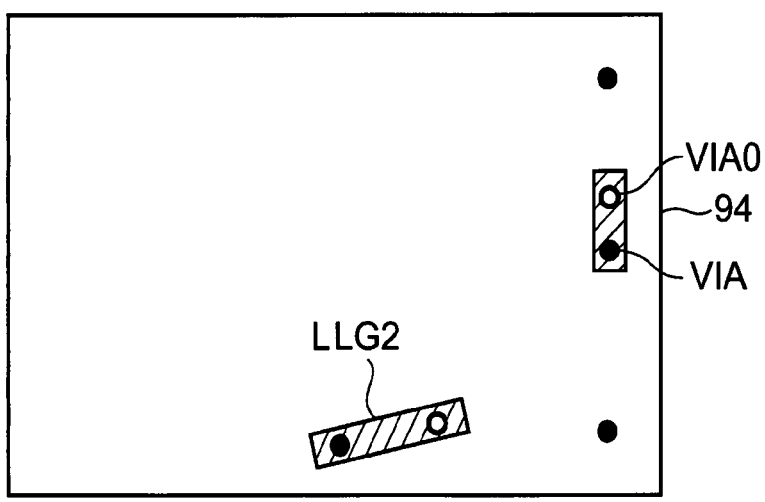
Figure 39C:
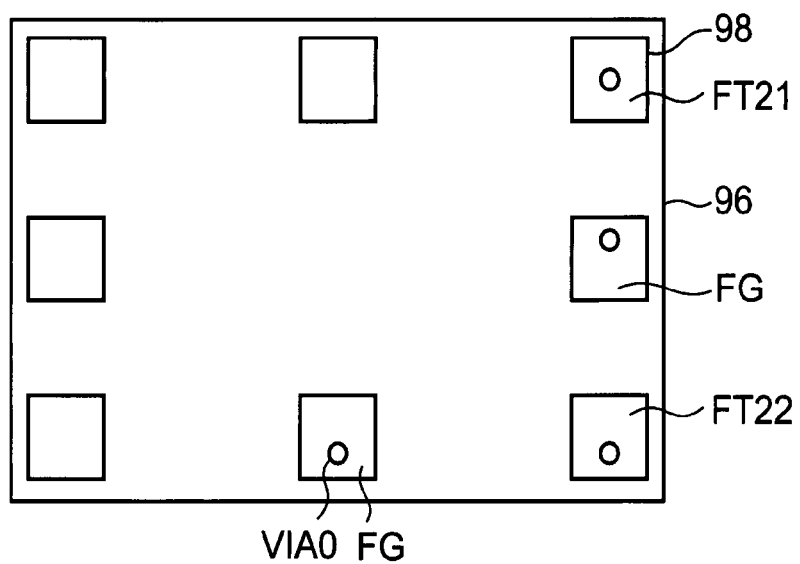

A ninth embodiment of the present invention is an example case where the inductors and the capacitors of the balun 40 are formed with chip inductors and chip capacitors. FIGS. 39A through 39C show the same stacked package as the stacked package shown in FIGS. 26A through 26C. It should be noted that each via VIA formed in each layer is indicated by a black dot, and each region to which the via from the layer above is connected is indicated by a white dot. As shown in FIG. 39A, the filter chip 11 is flip-chip mounted, and the unbalanced terminal T1 of the filter chip 11 is connected to a bump pad BF. A chip capacitor CCP is connected in series to the bump pad BF, and is connected to a foot pad FT21 that is a balanced terminal T21 shown in FIG. 39C via the via VIA. The foot pad FT21 is connected to a ground foot pad FG via a chip capacitor CLP. Likewise, a chip inductor CLS is connected in series to the bump pad BF, and is connected to a foot pad FT22 that is a balanced terminal T22 shown in FIG. 39C via the via VIA. The foot pad FT22 is connected to a node NG2 connected to the ground terminal of the filter chip 11 via a chip capacitor CCP. The node NG2 is connected to a ground terminal FG via a line pattern LLG2 forming the ground inductor LG2 of the intermediate layer 94 shown in FIG. 39B. In this manner, a balun can be formed with chip elements.

Tenth Embodiment

Figure 40A:
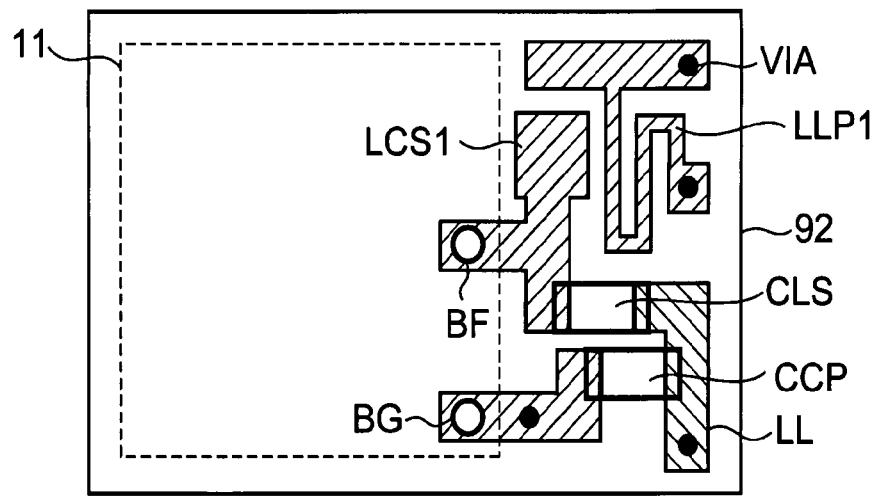
FIGS. 40A through 40C illustrate a stacked package in which a filter in accordance with a ninth embodiment of the present invention is mounted.
Figure 40B:
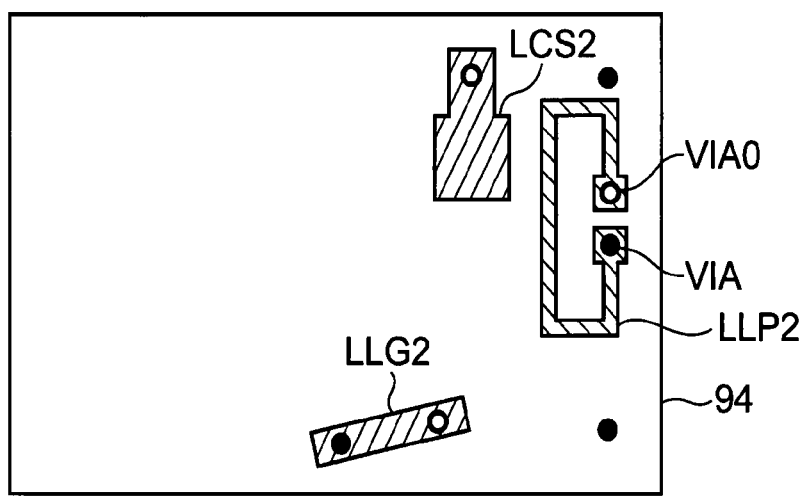
Figure 40C:
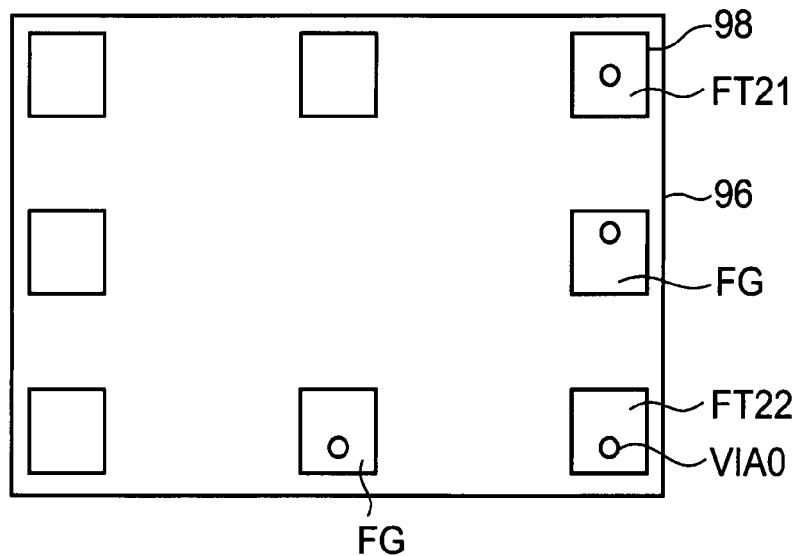

A tenth embodiment of the present invention is an example case where a line pattern formed on a stacked package is used as an inductor of the balun 40, and a capacitor between layers of the stacked package is used as a capacitor of the balun 40. FIGS. 40A through 40C show the respective layers of the same stacked package as the stacked package shown in FIGS. 39A through 39C. Instead of the chip capacitor CCS of the ninth embodiment, a MIM capacitor formed with an upper electrode LCS1 formed on the surface of the die-attach layer 96 and a lower electrode LCS2 formed on the surface of the intermediate layer 94 is employed. Instead of the chip inductor CLP, an inductor formed with a line pattern LLP1 formed on the surface of the die-attach layer 96 and a line pattern LLP2 formed on the surface of the intermediate layer 94 is employed. The other aspects of the structure of this embodiment are the same as those of the ninth embodiment, and explanation of them is omitted here. In this embodiment, a stacked package is used as the mounting unit, but the mounting unit only needs to have the function of mounting filters and may be a stacked substrate or the like.

As in the fifth embodiment, the balun 40 is preferably formed with inductors and capacitors that are integrated passive devices. Such inductors and capacitors that are integrated passive devices have high Q values, and can have smaller sizes at lower costs. However, as in the seventh through tenth embodiments, it is possible to employ, as the inductors of the balun 40, chip inductors, inductors formed with bonding wires, inductors formed with resonators, or inductors formed with line patterns provided on the mounting unit. Also, it is possible to employ, as the capacitors of the balun 40, chip capacitors, capacitors formed with resonators, or capacitors formed on the mounting unit.

The ground inductor LG2 may be an inductor formed with a line pattern provided on the mounting unit in which filters are mounted, as in the fifth, sixth, ninth, and tenth embodiments. Also, as in the seventh and eighth embodiments, it is possible to use a line pattern formed on the chip 110 in which filters are formed. Further, as in the eighth embodiment, an inductor formed with bonding wires may be employed.

Figure 1:
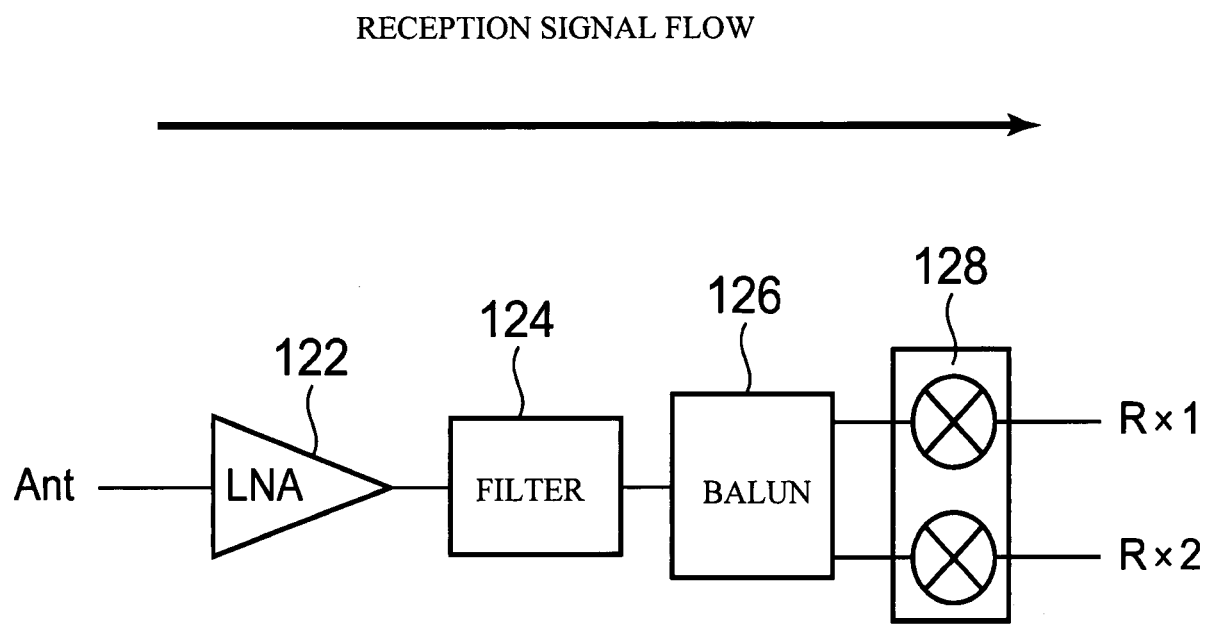
FIG. 1 is a block diagram of a reception circuit in the vicinity of the antenna of a portable telephone device equipped with a balanced mixer.
Figure 2:
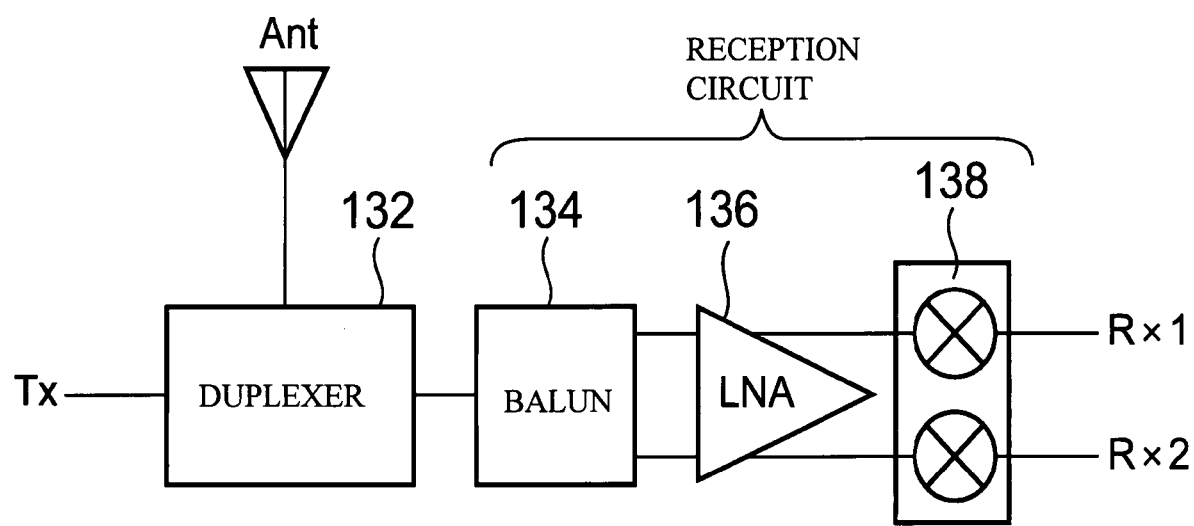
FIG. 2 is a block diagram of a reception circuit in the vicinity of the antenna of a portable telephone device equipped with a balanced low-noise amplifier and a balanced mixer.
Figure 3:
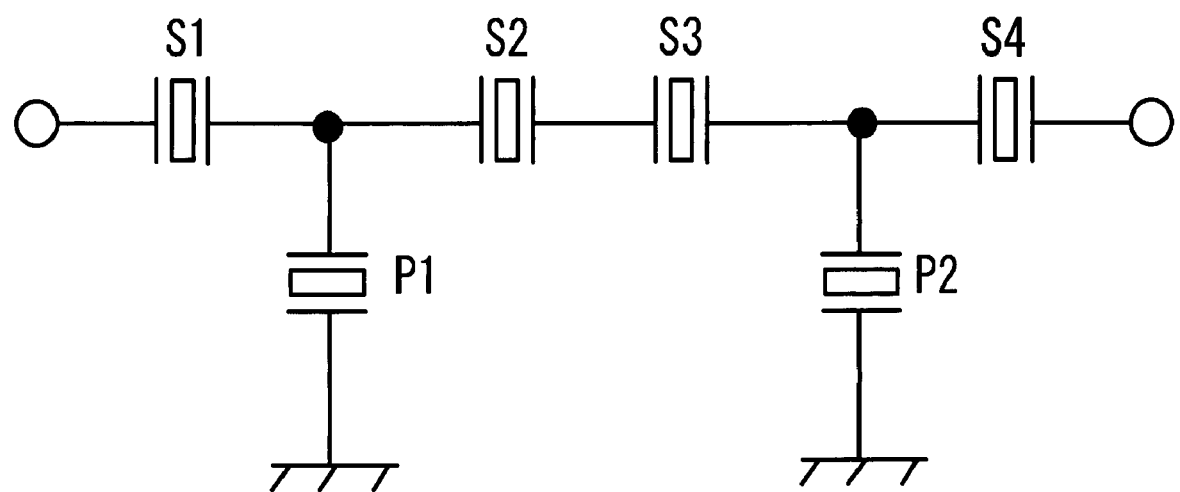
FIG. 3 is a circuit diagram of a ladder filter.
Figure 4A:
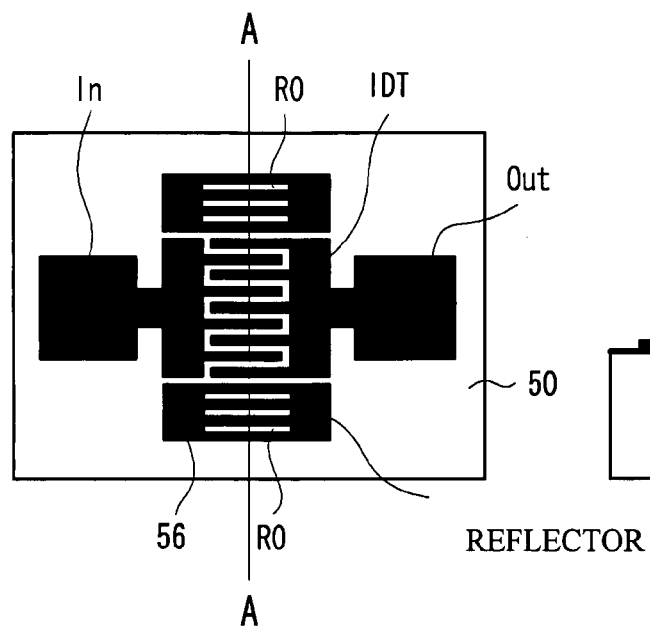
FIG. 4A is a plan view of a surface acoustic wave resonator.
Figure 4B:
FIG. 4B is a cross-sectional view of the surface acoustic wave resonator.
Figure 5A:
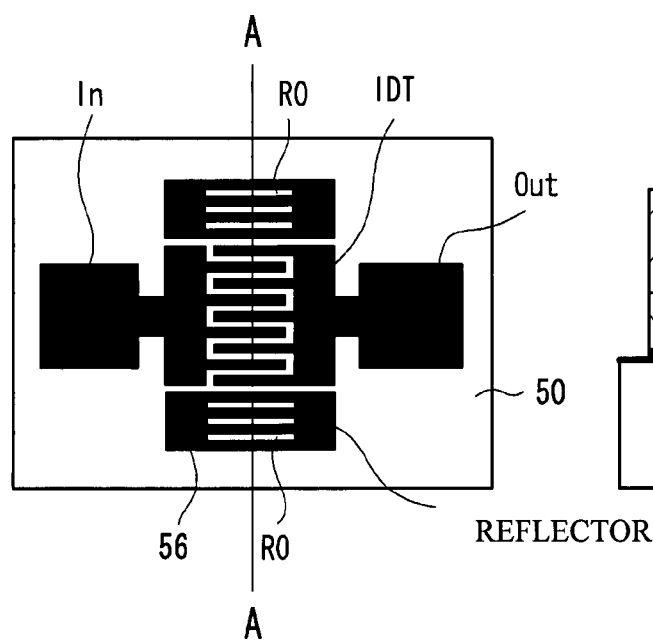
FIG. 5A is a plan view of a boundary acoustic wave resonator.
Figure 5B:
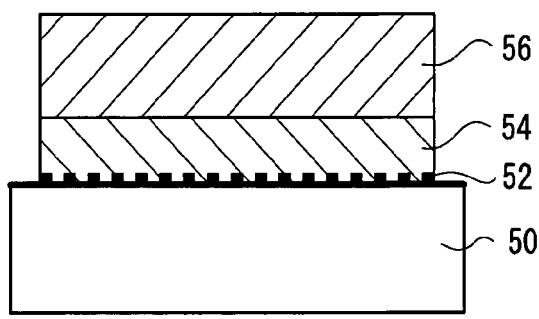
FIG. 5B is a cross-sectional view of the boundary acoustic wave resonator.
Figure 6A:
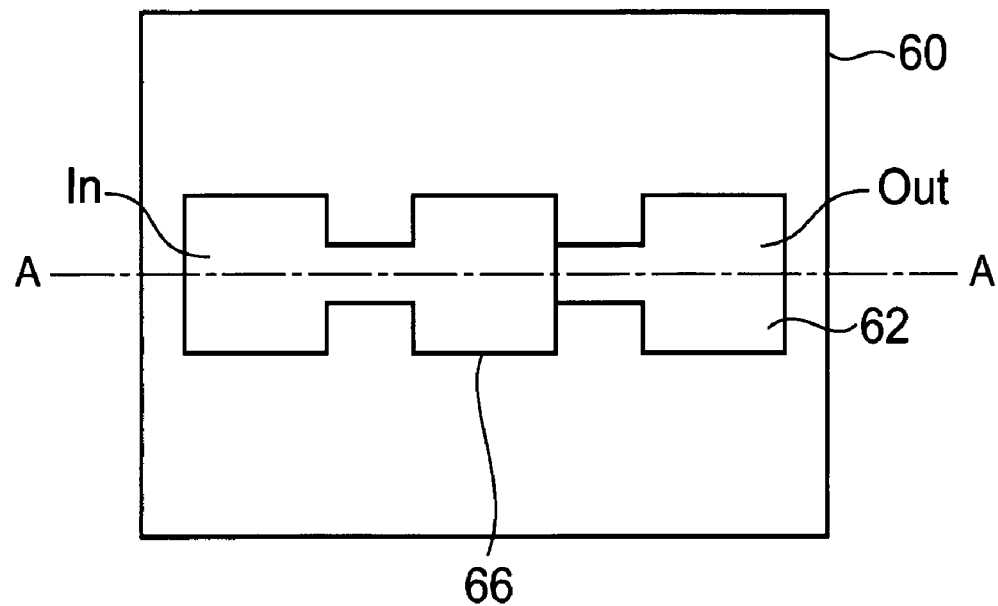
FIG. 6A is a plan view of a piezoelectric thin-film resonator.
Figure 6B:
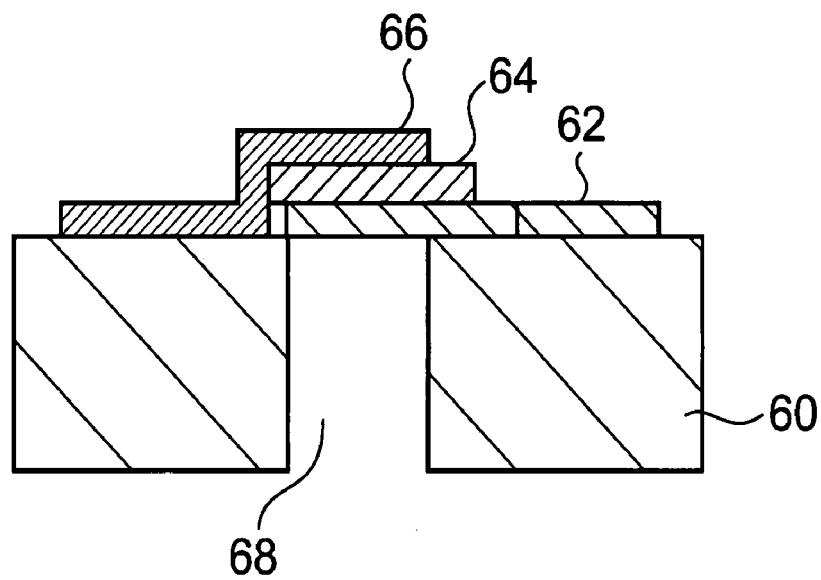
FIG. 6B is a cross-sectional view of the piezoelectric thin-film resonator.
Figure 7:
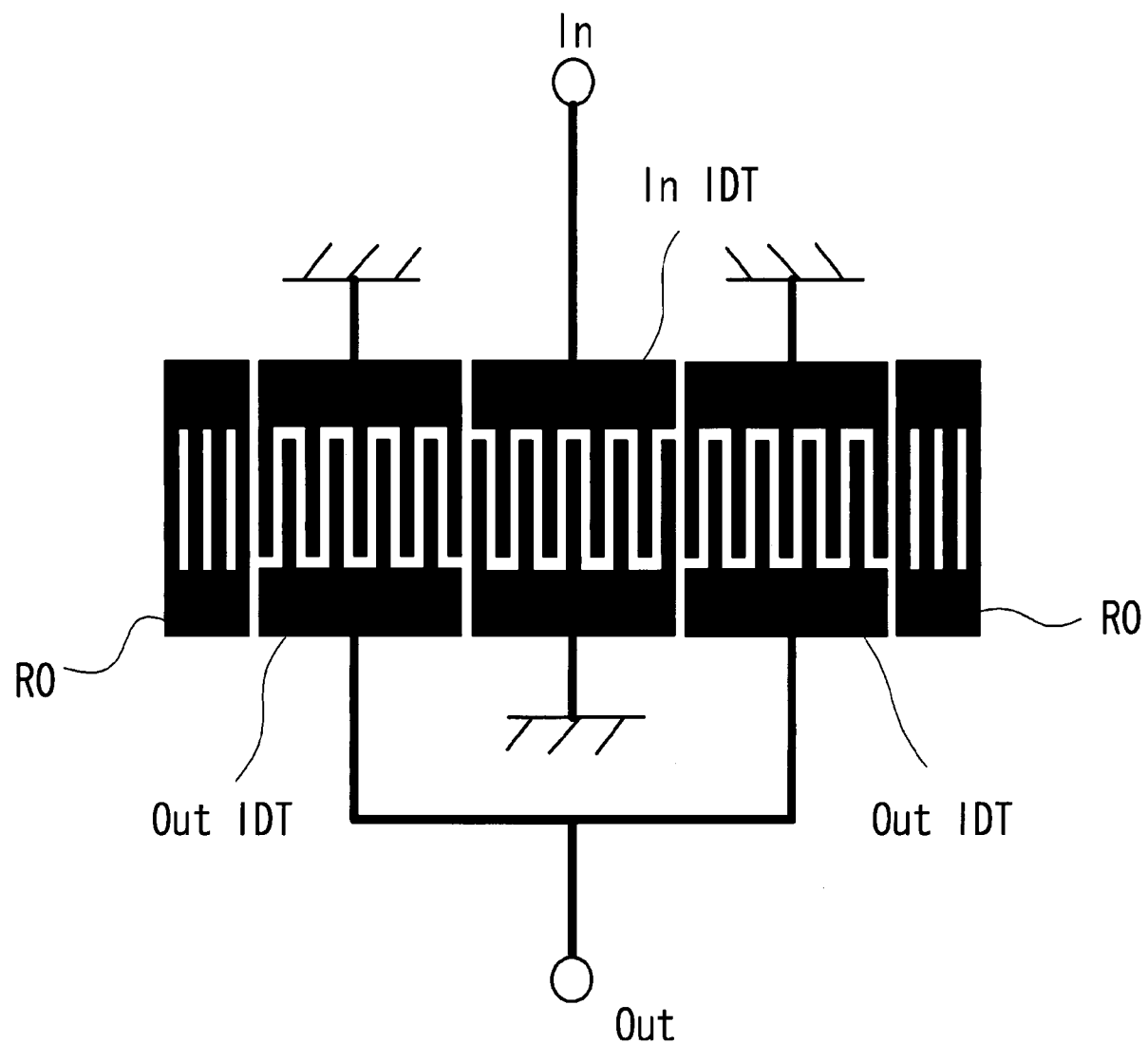
FIG. 7 is a plan view of a double-mode filter.
Figure 8:
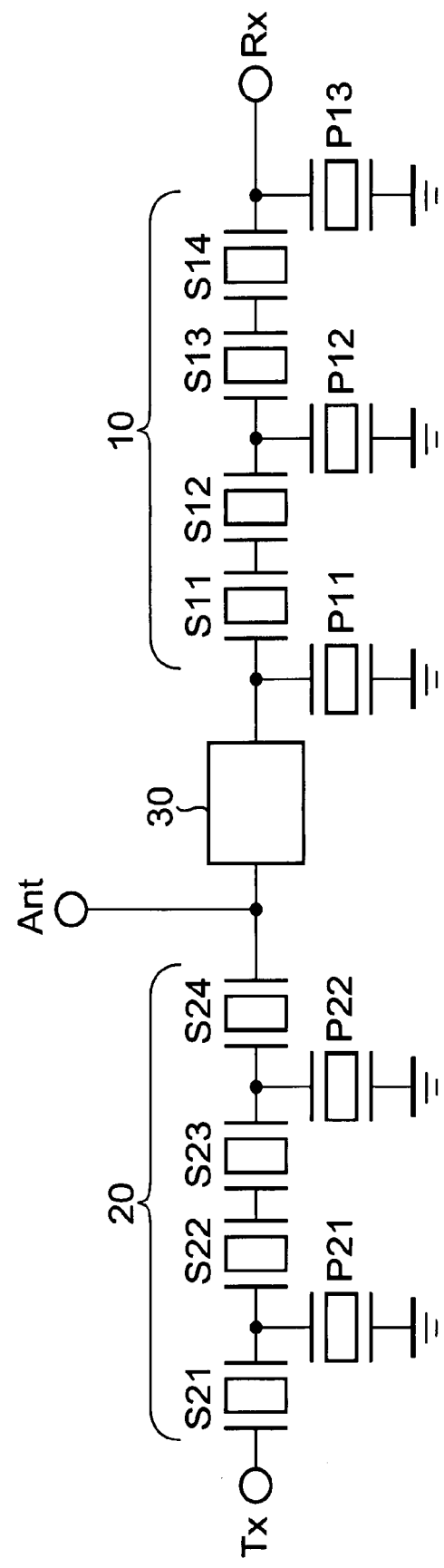
FIG. 8 is a circuit diagram of a duplexer.
Figure 9A:
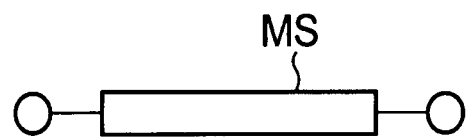
FIG. 9A shows a microstrip line.
Figure 9B:
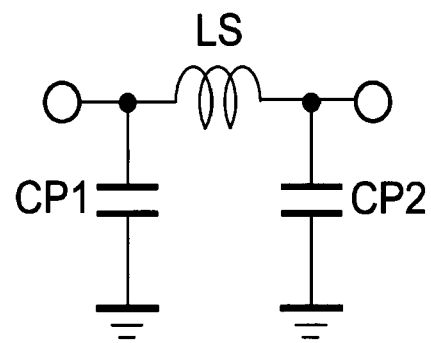
FIGS. 9B and 9C show lumped parameter phase shifters.
Figure 9C:
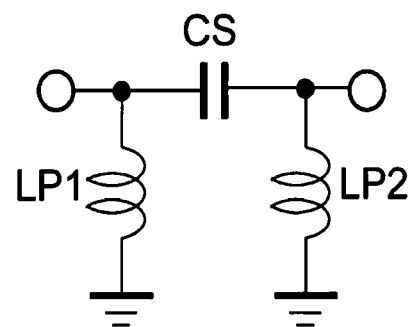
Figure 9D:
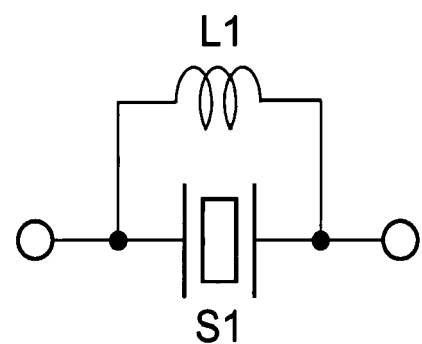
FIG. 9D is a circuit diagram of a resonator having a parallel inductor connected thereto.

In the first through fifth embodiments and the eighth through tenth embodiments, the filter 10 is a ladder filter, and the ground terminal is the terminal on the ground sides of the parallel-arm resonators P1 through P4. However, it is possible to employ the double-mode filters 15 as filters, as in the sixth embodiment. Furthermore, filters of some other type can be employed. As for resonators, the surface acoustic wave resonators shown in FIGS. 4A and 4B, the boundary acoustic wave resonators shown in FIGS. 5A and 5B, and the piezoelectric thin-film resonators shown in FIGS. 6A and 6B may be used.

Although the duplexer of the fourth embodiment is used in the fifth embodiment, the filters of the first through third embodiments and the sixth through tenth embodiments can be used for the duplexer of the fifth embodiment. Particularly, the filters of those embodiments are effective as reception filters that often receive differential signals.

The balun 40 in the first through tenth embodiments is the balun shown in FIG. 12A. However, any of the baluns shown in FIGS. 12B through 13B, or some other balun may be employed.

Finally, several aspects of the present invention are summarized as follows.

According to an aspect of the present invention, there is provided a balanced filter including: a filter that has at least one signal terminal; a balun that is a lumped parameter balun that inputs or outputs signals with different phases generated based on a signal input or output from the unbalanced signal terminal of the filter, the balun being formed with an integrated passive device; and a mounting unit in which the filter and the balun are flip-chip mounted. Thus, integrated passive device inductors and integrated passive device capacitors having high Q values can be used. Accordingly, the insertion loss can be reduced, and the phase balance can be improved.

According to another aspect of the present invention, there is provided a balanced filter including: a filter that has at least one signal terminal; a lumped parameter balun that inputs or outputs signals with different phases generated based on a signal input or output from the unbalanced signal terminal of the filter, the lumped parameter balun having two or more ground terminals; and a ground inductor that is connected between a node and a ground, the node being shared by at least one ground terminal of the filter and at least one of the ground terminals of the balun. Thus, the amplitude balance and the phase balance can be improved.

The balanced filter may be configured so that the balun includes: an unbalanced terminal and two balanced terminals; a first capacitor that is connected in parallel between the unbalanced terminal and one of the two balanced terminals, and a first inductor that is connected to one of the two balanced terminals and the ground; and a second inductor that is connected in series between the unbalanced terminals and the other one of the two balanced terminals, and a second capacitor that is connected to the other one of the two balanced terminals and the ground. The balanced filter may be configured so that each of the first capacitor, the first inductor, the second inductor, and the second capacitor is a single component.

The balanced filter may be configured so that the at least one of the ground terminals of the balun is a terminal on a ground side of the second capacitor. With this structure, the phase balance can be further improved.

The balanced filter may be configured so that: the filter includes a plurality of ground terminals; and the at least one ground terminal of the filter is among the plurality of ground terminals. With this structure, the phase balance can be further improved.

The balanced filter may be configured so that: a part of ground terminals of the filter is connected to a ground inductor to which the ground side of the second capacitor is connected; and the rest of the ground terminals of the filter is connected to another ground inductor, not being connected to a ground side of the balun. With this structure, the phase balance can be further improved.

The balanced filter may be configured so that: a part of ground terminals of the filter is connected to a ground inductor to which the ground side of the second capacitor is connected; and the rest of the ground terminals of the filter is connected to another ground inductor to which a ground side of the first inductor is connected. With this structure, the phase balance can be further improved.

The balanced filter may be configured so that the balun includes an inductor formed with an integrated passive device. The balanced filter may be configured so that the balun includes one of a chip inductor, an inductor formed with a bonding wire, an inductor formed with a resonator, and an inductor formed with a line pattern formed on the mounting unit in which the filter is mounted. The balanced filter may be configured so that the balun includes a capacitor formed with an integrated passive device. The balanced filter may be configured so that the balun includes one of a chip capacitor, a capacitor formed with a resonator, and a capacitor formed on the mounting unit in which the filter is mounted. The balanced filter may be configured so that the ground inductor is one of an inductor formed with a bonding wire, an inductor formed with a line pattern provided on the mounting unit in which the filter is mounted, and a line pattern provided in a chip in which the filter is formed. The balanced filter may be configured so that: the filter is a ladder filter; and the at least one ground terminal is a terminal on a ground side of a parallel-arm resonator. The balanced filter may be configured so that the ladder filter includes one of a surface acoustic wave resonator, a boundary acoustic wave resonator, and a piezoelectric thin-film resonator. The balanced filter may be configured so that the filter includes a double-mode filter. The balanced filter may be configured so that the double-mode filter is a double-mode surface acoustic wave filter or a double-mode boundary acoustic wave filter. The balanced filter may be configured so that a third inductor is connected between the node and the double-mode filter.

According to a further aspect of the present invention, there is provided a duplexer including: a common terminal; and two filters that are connected to the common terminal, at least one of the two filters being the balanced filter as mentioned above. Thus, loss can be kept low. Also, the amplitude balance and the phase balance can be improved.

The balanced filter may be a reception filter. Thus, the balun can be used in a reception filter that involves differential signals.

In accordance with the present invention, a balun formed with lumped parameter devices having high Q values is employed, so as to provide a balanced filter and a duplexer with low insertion loss. Also, the present invention can provide a balanced filter and a duplexer that have greatly improved amplitude balance and phase balance.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2006-141956 filed May 22, 2006, the entire disclosure of which is hereby incorporated by reference.

What is claimed is:

1. A balanced filter comprising:
   a filter that has at least one unbalanced signal terminal;
   a balun that is a lumped parameter balun that inputs or outputs signals with different phases generated based on a signal input or output from the unbalanced signal terminal of the filter, the balun being formed with an integrated passive device; and
   a mounting unit in which the filter and the balun are flip-chip mounted.

2. A balanced filter comprising:
   a filter that has at least one unbalanced signal terminal;
   a lumped parameter balun that inputs or outputs signals with different phases generated based on a signal input or output from the unbalanced signal terminal of the filter, the lumped parameter balun having two or more ground terminals; and
   a ground inductor that is connected between a node and a ground, the node being shared by at least one ground terminal of the filter and at least one of the ground terminals of the balun.

3. The balanced filter as claimed in claim 2, wherein the balun includes:
   an unbalanced terminal and two balanced terminals;
   a first capacitor that is connected in series between the unbalanced terminal and one of the two balanced terminals, and a first inductor that is connected to one of the two balanced terminals and the ground; and
   a second inductor that is connected in series between the unbalanced terminals and the other one of the two balanced terminals, and a second capacitor that is connected to the other one of the two balanced terminals and the ground.

4. The balanced filter as claimed in claim 3, wherein each of the first capacitor, the first inductor, the second inductor, and the second capacitor is a single component.

5. The balanced filter as claimed in claim 3, wherein the at least one of the ground terminals of the balun is a terminal on a ground side of the second capacitor.

6. The balanced filter as claimed in claim 3, wherein:
   the filter includes a plurality of ground terminals; and
   the at least one ground terminal of the filter is among the plurality of ground terminals.

7. The balanced filter as claimed in claim 3, wherein:
   a part of ground terminals of the filter is connected to a ground inductor to which the ground side of the second capacitor is connected; and
   the rest of the ground terminals of the filter is connected to another ground inductor, not being connected to a ground side of the balun.

8. The balanced filter as claimed in claim 3, wherein:
   a part of ground terminals of the filter is connected to a ground inductor to which the ground side of the second capacitor is connected; and
   the rest of the ground terminals of the filter is connected to another ground inductor to which a ground side of the first inductor is connected.

9. The balanced filter as claimed in claim 1, wherein the balun includes an inductor formed with an integrated passive device.

10. The balanced filter as claimed in claim 1, wherein the balun includes one of a chip inductor, an inductor formed with a bonding wire, an inductor formed with a resonator, and an inductor formed with a line pattern formed on the mounting unit in which the filter is mounted.

11. The balanced filter as claimed in claim 1, wherein the balun includes a capacitor formed with an integrated passive device.

12. The balanced filter as claimed in claim 1, wherein the balun includes one of a chip capacitor, a capacitor formed with a resonator, and a capacitor formed on the mounting unit in which the filter is mounted.

13. The balanced filter as claimed in claim 1, wherein the ground inductor is one of an inductor formed with a bonding wire, an inductor formed with a line pattern provided on the mounting unit in which the filter is mounted, and a line pattern provided in a chip in which the filter is formed.

14. The balanced filter as claimed in claim 2, wherein:

the filter is a ladder filter; and the at least one ground terminal is a terminal on a ground side of a parallel-arm resonator.

15. The balanced filter as claimed in claim 14, wherein the ladder filter includes one of a surface acoustic wave resonator, a boundary acoustic wave resonator, and a piezoelectric thin-film resonator.

16. The balanced filter as claimed in claim 2, wherein the filter includes a double-mode filter.

17. The balanced filter as claimed in claim 16, wherein the double-mode filter is a double-mode surface acoustic wave filter or a double-mode boundary acoustic wave filter.

18. The balanced filter as claimed in claim 16, wherein a third inductor is connected between the node and the double-mode filter.

19. A duplexer comprising:

a common terminal; and two filters that are connected to the common terminal, at least one of the two filters being the balanced filter including:

a filter part that has at least one unbalanced signal terminal;

a balun that is a lumped parameter balun that inputs or outputs signals with different phases generated based on a signal input or output from the unbalanced signal terminal of the filter part, the balun being formed with an integrated passive device; and a mounting unit in which the filter part and the balun are flip-chip mounted.

20. The duplexer as claimed in claim 19, wherein the balanced filter is a reception filter.

* * * * *